United States Patent
Takahashi et al.

(10) Patent No.: US 6,925,016 B2
(45) Date of Patent: Aug. 2, 2005

(54) SEMICONDUCTOR MEMORY AND METHOD FOR ENTERING ITS OPERATION MODE

(75) Inventors: Hiroyuki Takahashi, Kanagawa (JP); Takato Shimoyama, Kanagawa (JP); Takashi Kusakari, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 166 days.

(21) Appl. No.: 10/467,031

(22) PCT Filed: Jan. 30, 2002

(86) PCT No.: PCT/JP02/00728

§ 371 (c)(1),
(2), (4) Date: Aug. 1, 2003

(87) PCT Pub. No.: WO02/061754

PCT Pub. Date: Aug. 8, 2002

(65) Prior Publication Data

US 2004/0080993 A1 Apr. 29, 2004

(30) Foreign Application Priority Data

Feb. 1, 2001 (JP) ........................................ 2001-026148
Jan. 25, 2002 (JP) ........................................ 2002-016951

(51) Int. Cl.[7] ............................................. G11C 7/00
(52) U.S. Cl. ............................ 365/189.07; 365/189.05; 365/189.12; 365/230.06; 365/230.08
(58) Field of Search ...................... 365/189.07, 189.05, 365/189.08, 189.12, 230.06, 230.08

(56) References Cited

U.S. PATENT DOCUMENTS

| 5,506,726 A | 4/1996 | Tahira |
| 5,521,873 A | 5/1996 | Ohsawa |
| 5,778,440 A | 7/1998 | Yiu et al. |
| 6,246,614 B1 * | 6/2001 | Ooishi ........................ 365/191 |

FOREIGN PATENT DOCUMENTS

JP  62-180398  11/1987

* cited by examiner

*Primary Examiner*—Son T. Dinh
(74) *Attorney, Agent, or Firm*—Choate, Hall & Stewart LLP

(57) ABSTRACT

There is provided a method of entry of an operation mode of a semiconductor memory during operations without need of any specific timing specification and with effective suppression to any erroneous entry. If read cycles for plural addresses are continued, then, a request for entry of operation mode is accepted. In write cycles following to those read cycles, an operation mode to be entered is decided based on data externally designated, wherein in the first write cycle, the kind of the operation mode is set, and then in the next write cycle, conditions for the operation mode are set for the entry of the operation mode of the semiconductor memory.

36 Claims, 14 Drawing Sheets

| I/O1 | I/O2 | operation mode |
|---|---|---|
| 0 | 0 | partial refresh mode |
| 0 | 1 | page length setting mode |
| 1 | 1 | test mode |

(b)

| I/O1 | I/O2 | refresh area |
|---|---|---|
| 0 | 0 | 16M |
| 1 | 0 | 8M |
| 0 | 1 | 4M |
| 1 | 1 | absent |

(c)

| I/O3 | page length |
|---|---|
| 0 | 4-words |
| 1 | 8-words |

SEMICONDUCTOR MEMORY AND METHOD FOR ENTERING ITS OPERATION MODE

TECHNICAL FIELD

The present invention relates to a semiconductor memory device configured to enable circuits to change in accordance with an entered operation mode and a method of entry of the operation mode thereof, and more particularly to a technique for entry of the operation mode.

BACKGROUND OF THE ART

In recent years, a mobile telephone has been attracted as an information terminal for the Internet, wherein the mobile telephone is required to have a function of storing various kinds of data such as distributed image data and character data. The information terminal of such kind has an integration of a DRAM (Dynamic Random Access Memory) with a large capacity as a buffer memory for storing distributed data.

It is necessary for DRAM to perform cyclic operations for refreshing data stored in memory cells. A consumed current caused by this refresh operation depends on a storage capacity. In the refresh operation, data are re-written with sequential selections of rows of a memory cell array. If the storage capacity is large, then a large number of rows have to be selected in a unit time. For this reason, it is necessary to set a short cycle for refresh operation. Thus, a semiconductor memory with a large capacity shows a tendency to increase a power consumption caused by the refresh operation, resulting in an increased burden to a battery of the mobile telephone integrating this semiconductor memory.

If data with a small size have to be stored in a buffer memory of the mobile telephone, then the memory cell array of the DRAM has an increased ratio or proportion of an area free of any effective data, thereby causing unnecessary refresh operations with unnecessary consumption of current. A partial refresh mode has been know as an operation mode which suppresses generation of such unnecessary current consumption. Utilization of this partial refresh mode enables a selective refresh to a partial area which stores useful data, and effectively suppresses generation of an unnecessary current consumption.

In the field of mobile telephones, there is a requirement for adaptively switching operation modes such as refresh mode for DRAM over applications, dependent upon a scale of the stored data.

For the conventional DRAM, an input signal, which is uniquely specified in input timings, is necessary for switching the operation modes. This makes a timing design complicated in the side of a device integrated with DRAM of such kind.

The present invention was made in view of the above circumstances, and its object is to provide a semiconductor memory device and a method of entry of its operation modes for enabling entry of the operation modes during operations with effective suppression to any erroneous entry and without need of any special timing specification.

DISCLOSURE OF INVENTION

In order to solve the above issues, the present invention has the following constitutions. In accordance with the present invention, a method of entry of operation mode of a semiconductor memory includes: (a) a first step of accepting a request for an operation mode entry when read cycles for plural addresses continued (corresponding to Steps S1~S3 to be described later); and (b) a second step of deciding an operation mode to be entered, based on data designated in a write cycle following to the read cycles(corresponding to Steps S4~S7 to be described later).

In accordance with this configuration, for example, if read cycles are continued according to predetermined timings, then a request for operation mode entry is accepted by the semiconductor memory. Plural addresses designated in the continuous read cycles have a predetermined relationship such as being identical with each other. If the plural addresses are entered which satisfy this relationship, then the entry is enabled. Accordingly, the entry may be accepted during operation without need of any special timing specification, and any erroneous entry may be effectively suppressed. The operation mode is decided based on data designated in a write cycle according to a predetermined timing and following to the read cycle.

In order to accept the operation mode-entry, timing specifications for read cycle and write cycle may be predetermined standard specifications, but it is necessary that the cycles for the plural addresses are continued. In accordance with this configuration, the operation mode entry may be accepted and decided during operation without need of any special timing specification.

The plural addresses designated by the read cycles may be either different from each other or identical with each other, provided that the plural addresses are addresses predetermined as to be designated in respective continuous cycles for entry of the operation mode.

The first step includes the steps of: comparing a first specific address previously stored (corresponding to a final address "1FFFFFh" to be described later) to addresses designated sequentially and externally in the read cycles; and judging that at least two read cycles for the first specific address have been continued, upon receipt of a result of the comparison.

The second step includes the steps of: comparing a second specific address previously stored (corresponding to a top address "000000h" to be described later) to addresses designated sequentially and externally in the write cycle following to the read cycles; and deciding an operation mode based on data designated in the write cycle, upon receipt of a result of the comparison.

The first step is to accept an operation mode entry if addresses identical with each other (corresponding to a final address "1FFFFFh" to be designated in read cycles T3 and T4 respectively and to be described later) were designated as the plural addresses.

The first step is to accept an operation mode entry if any one of a final address (corresponding to a final address "1FFFFFh" to be described later) and a top address (corresponding to a top address "000000h" to be described later) was designated as the plural addresses.

The second step is to accept an operation mode entry if one of a final address and a top address was designated as an address for the read cycle, and the second step is to decide an operation mode to be entered if another of the final address and the top address was designated as an address for the write cycle.

The first step is to accept a partial refresh mode as an operation mode to be entered for refreshing a partial area in a memory cell array comprising a matrix array of dynamic memory cells, and the second step is to decide the partial refresh mode as the operation mode to be entered.

In accordance with the present invention, a semiconductor memory configured to enable an operation mode entry during operation thereof includes: an operation mode entry circuit (corresponding to an operation mode entry circuit MOD to be described later) for accepting a request for an operation mode entry when read cycles for plural addresses continued; and for deciding an operation mode to be entered, based on data designated in a write cycle following to the read cycles.

In accordance with this configuration, for example, if read cycles are continued according to predetermined timings, then a request for operation mode entry is accepted by the operation mode entry circuit. Plural addresses designated in the continuous read cycles have a predetermined relationship such as being identical with each other. If the plural addresses are entered which satisfy this relationship, then the entry is enabled. Accordingly, the entry may be accepted during operation without need of any special timing specification, and any erroneous entry may be effectively suppressed.

The operation mode entry circuit decides the operation mode based on data designated in a write cycle according to a predetermined timing and following to the read cycle. Finally, the operation mode entry circuit makes entry of the operation mode but only in the read and write cycles according to the predetermined timings. Accordingly, the operation mode to be entered may be decided during operation without need of any special timing specification.

In the semiconductor memory, the operation mode entry circuit includes: a storage unit (corresponding to a read address register REG or a read address register RREG to be described later) for storing a first specific address to be designated externally in the read cycles; a comparing unit (corresponding to a comparator CMP or a read address comparator RCMP to be described later) for comparing the first specific address stored in the storage unit to addresses designated sequentially and externally; and a judging unit (corresponding to a circuit, which comprises latches LATA, LATB, a logic-AND gate GA, and a latch control unit LCNT, or corresponding to a mode judging circuit MDJ to be described later) for judging that at least two read cycles for the first specific address have been continued, upon receipt of a result of the comparison by the comparing unit.

In the semiconductor memory, the operation mode entry circuit includes: a storage unit (corresponding to a write address register WREG to be described later) for storing a second specific address to be designated externally in the write cycle following to the read cycles; a comparing unit (corresponding to a write address comparator WCMP to be described later) for comparing the second specific address stored in the storage unit to addresses designated sequentially and externally; and a deciding unit (corresponding to a mode setting circuit MDS to be described later) for deciding an operation mode based on data designated in the write cycle, upon receipt of a result of the comparison by the comparing unit.

In the semiconductor memory, the operation mode entry circuit accepts an operation mode entry if addresses identical with each other were designated as the plural addresses.

In the semiconductor memory, the operation mode entry circuit accepts an operation mode entry if any one of a final address and a top address was designated as the plural addresses.

In the semiconductor memory, the operation mode entry circuit accepts an operation mode entry if one of a final address and a top address was designated as an address for the read cycle, and if another of the final address and the top address was designated as an address for the write cycle.

In the semiconductor memory, the operation mode entry circuit accepts a partial refresh mode as an operation mode to be entered for refreshing a partial area in a memory cell array comprising a matrix array of dynamic memory cells.

In accordance with the present invention, a method of entry of operation mode of a semiconductor memory is provided. The semiconductor memory includes: a memory cell array (MARY in FIG. 1) comprising an array of plural memory cells; an address terminal (ADD in FIG. 1) for input of address; a data terminal (DQ in FIG. 1) for input and output of data; control terminals (/CS, /WE, and /OE in FIG. 1) for input of a control signal for an access control, a write control, and an output control of read data for the semiconductor memory. The entry method is made by an operation mode entry circuit (MOD) for entry of an operation mode of the semiconductor memory, based on addresses inputted into the address terminal, control signals inputted into control terminals (/CS, /WE, and /OE in FIG. 1) and data inputted into the data terminal. The method includes the steps of: judging whether a current cycle is a read cycle or a write cycle based on a control signal inputted into the control terminal; comparing and judging (S1 in FIG. 2) whether or not an address inputted into the address terminal is identical with a predetermined address if the current cycle is the read cycle; comparing and judging (S2 in FIG. 2) whether or not respective addresses inputted into the address terminal are identical with predetermined addresses in one or more read cycles following to the read cycle if an identity of the address was confirmed; setting (S3 in FIG. 2), into an active state, a mode entry signal for controlling the enabling of the operation mode entry if an identity of the address was detected in the continuing plural read cycles; and comparing and judging (S4~S7 in FIG. 2) whether or not an address inputted into the address terminal in at least one write cycle following to the continuing plural read cycles is identical with a predetermined address, and deciding an operation mode to be entered based on data inputted into the data terminal if the identity is detected.

In the method according to the present invention, the step of deciding the operation mode to be entered may include the steps of: comparing and judging (S4 in FIG. 2) whether or not an address inputted into the address terminal is identical with a predetermined address in a write cycle following to the plural read cycles; selecting (S5 in FIG. 2) a kind of an operation mode based on data inputted into the data terminal in the write cycle if an address identity is confirmed; comparing and judging (S6 in FIG. 2) whether or not an address inputted into the address terminal is identical with a predetermined address in a next write cycle to the write cycle; and setting (S7 in FIG. 2) conditions for the operation mode based on data inputted into the data terminal in the next write cycle if an address identity is confirmed.

In accordance with the present invention, a semiconductor device includes: a memory cell array (MARY in FIG. 1) comprising an array of plural memory cells; an address terminal (ADD in FIG. 1)for input of address; a data terminal (DQ in FIG. 1)for input and output of data; control terminals (/CS, /WE and /OE in FIG. 1) for input of a control signal for an access control, a write control, and an output control of read data for the semiconductor memory; an operation mode entry circuit (MOD in FIG. 1) for controlling an entry of an operation mode of the semiconductor memory device, based on addresses inputted into the address terminal, control signals inputted into the control terminals (/CS, /WE and /OE in FIG. 1), and data inputted into the data terminal. The operation mode entry circuit (MOD in FIG. 1) further includes: means (corresponding to a read write judging unit RWJ to be described later with reference to FIG. 5) for judging whether a current cycle is a read cycle or a write cycle based on the control signal inputted into the control terminal; means (corresponding to a read address register RREG and a read address comparator RCMP to be described later, or corresponding to an address register AREG and an address comparator RCMP in FIG. 14) for comparing and judging whether or not an address inputted into the address terminal is identical with a predetermined address if the current cycle is the read cycle; means (corresponding to an address judging circuit ADJ to be described with reference to FIGS. 5 and 6 or corresponding to registers REG1, REG2, and NAND1~NAND3 in FIG. 14) for setting, into an active state, a mode entry signal which controls the enabling of the operation mode entry, if an address inputted into the address terminal in one or more read cycles following to the read cycle is identical with a predetermined address if an identity of the address was confirmed in the read cycle; and means (corresponding to a mode setting unit CDE in FIG. 5 to be described later) for comparing and judging whether or not an address inputted into the address terminal in at least one write cycle following to the plural read cycles is identical with a predetermined address, and for deciding an operation mode to be entered based on data inputted into the data terminal if the identity is detected.

In accordance with this invention, the means (corresponding to a mode setting unit CDE in FIG. 5 to be described later) for deciding the operation mode to be entered includes: an address comparing means (corresponding to a write address register WREG and a write address comparator WCMP to be described with reference to FIG. 6 or corresponding to an address register AREG and an address comparator ACMP to be described with reference to FIG. 14) for comparing and judging whether or not an address inputted into the address terminal is identical with a predetermined address in a write cycle following to the plural read cycles; means (corresponding to a mode selecting circuit MODSEL to be described with reference to FIG. 14) for selecting a kind of an operation mode based on data inputted into the data terminal in the write cycle if an address identity is confirmed as a result of the comparison; and means (corresponding to a command decoder MDS to be described with reference to FIG. 6, or corresponding to registers REG6 and REG7, and a partial refresh switching signal generating circuit PEGEN to be described with reference to FIG. 14) for comparing and judging whether or not an address inputted into the address terminal is identical with a predetermined address in a next write cycle to the write cycle, and for setting conditions for the operation mode based on data inputted into the data terminal in the next write cycle if an address identity is confirmed as a result of the comparison.

In accordance with the present invention, a semiconductor device may include: a memory cell array (MARY in FIG. 1) comprising an array of plural memory cells; an address terminal (ADD in FIG. 1) for input of address; a data terminal (DQ in FIG. 1)for input and output of data; first to third control terminals for respective inputs of a first control signal (a chip select signal /CS in FIG. 1) for controlling selection of a semiconductor memory, a second control signal (an output enable signal /OE in FIG. 1) for controlling an input and an output of data from the data terminal; and a third control signal (a write enable signal /WE in FIG. 1) for controlling data write and read operations; and an operation mode entry circuit (MOD in FIG. 1) for controlling an entry of an operation mode of the semiconductor memory device, based on addresses inputted into the address terminal, control signals inputted into the first to third control terminals, and data inputted into the data terminal. The operation mode entry circuit (MOD in FIG. 1) preferably includes: a read write judging unit (RWJ in FIG. 5) for judging whether a current cycle is a read cycle or a write cycle based on the second and third control signals if the first control signal is in an active state, and for outputting a read write identity signal; a mode judging unit (ADJ in FIG. 5) for judging a presence of an absence of a request for entry, based on an address designated in the read cycle, and for outputting a mode entry signal (MENT in FIGS. 1 and 5) which controls enabling of an operation mode entry, and the mode judging unit further including: an address comparator for comparing and judging whether or not an address inputted into the address terminal is identical with a predetermined address if the read write judging unit judges that the current cycle is the read cycle; and means for setting the mode entry signal into an active state if the address comparator indicates identitys continuously in one or more read cycles following to the read cycle; and a mode setting unit (CDE) for generating and outputting mode data (MDATA in FIGS. 1 and 5) based on command data supplied to the data terminal in at least one write cycle following to the continuos plural read cycles if the entry signal is in the active state.

In the semiconductor device according to the present invention, the mode judging unit (ADJ) includes: means (corresponding to latches LATA, LATB to be described with reference to FIG. 7, or corresponding to registers RA and RB to be described with reference to FIG. 13, or corresponding to registers REG1 and REG2 to be described with reference to FIG. 14) for detecting that the address comparator indicates identitys continuously in plural read cycles; and means (corresponding to a gate GA to be described with reference to FIG. 7, or corresponding to a gate GA to be described with reference to FIG. 13, or corresponding to an SR-flip-flop to be described with reference to FIG. 14) for setting the mode entry signal in the active state if it is detected that the address comparator indicates identitys continuously in plural read cycles, and for re-setting the mode entry signal in an inactive state if the address comparator indicates non-identity.

In the semiconductor device according to the present invention, the mode setting unit (CDE in FIG. 5) may include: a write address register (WREG in FIG. 5) for storing a predetermined write address; a write address comparing unit (WCMP in FIG. 5)for comparing and judging whether or not an address inputted into the address terminal is identical with the predetermined write address stored in the write address register if the read write judging unit judges that a cycle following to the read cycle is a write cycle; and a command decoder (MDS in FIG. 5) for deciding an operation mode to be entered, based on data entered through the data terminal and for outputting the decided operation mode as mode data if the write address comparing unit judges an identity.

In the semiconductor device according to the present invention, the mode judging unit (ADJ) may include: a read address register (RREG in FIG. 7) for storing a predetermined read address; a read address comparator (RCMP in FIG. 7) for comparing an address inputted through the address terminal to the read address stored in the read address register at a timing of output of a pulse signal (SATD) upon an address transition by an address transition detecting circuit, and for outputting an address detecting signal upon detection that the input address is identical with the read address; first and second latch circuits (LATA and LATB in FIG. 7) for latching the address detection signal based on input first and second latch signals (SCA and SCB in FIG. 7) respectively, and for outputting first and second address detection signals; a logic gate circuit (GA in FIG. 7) for operating a logical-AND of the first and second address detection signals and a read write identity signal (SRW in FIG. 7) from the read write judging unit, and for outputting a result of the operations as the mode entry signal; and a latch control unit (LCNT in FIG. 7) for generating and outputting first and second latch signals (SLA and SLB in FIG. 7) which control latch operations of the first and second latch circuits respectively, based on a pulse signal (SATD in FIG. 7) outputted upon an address transition from the address transition detecting circuit, and also based on the first control signal (/CS in FIG. 7).

In the semiconductor device according to the present invention, the latch control unit (LCNT in FIG. 7) may include: a toggle flip-flop circuit (TRF in FIG. 8) for receiving an input of the first control signal and for inverting a value of its output signal by triggering a transition into an active state of the first control signal; a first logic gate circuit (GAA in FIG. 7) for receiving an input of the pulse signal (SATD in FIG. 8) which is outputted at an address transition from the address transition detecting circuit and also an input of an inverted signal of the output signal from the toggle flip-flop circuit (TRF in FIG. 8), and for outputting a result of a logical-AND operation of the two inputs as a first latch signal; and a second logic gate circuit (GAB in FIG. 7) for receiving an input of the pulse signal (SATD in FIG. 8) which is outputted at an address transition from the address transition detecting circuit and also an input of the output signal from the toggle flip-flop circuit (TRF in FIG. 8), and for outputting a result of a logical-AND operation of the two inputs as a second latch signal.

In the semiconductor device according to the present invention, the read write judging unit (RWJ) may include: a first logic gate circuit (GAC in FIG. 9) for receiving, through first and second input terminals, an inversion signal of the first control signal (/CS) and an inversion signal of the second control signal respectively and also receiving, through a first input terminal, the third control signal, and for outputting, from an output terminal, a logical-AND of the three input signals; a second logic gate circuit (GAD in FIG. 9) for receiving, through first and third input terminals, an inversion signal of the first control signal and an inversion signal of the third control signal respectively and also receiving, through a second input terminal, the second control signal, and for outputting, from an output terminal, a logical-AND of the three input signals; and an SR-flip-flop (SRF in FIG. 9) for receiving, through a set terminal, the output signal from the output terminal of the first logic gate circuit (GAC in FIG. 9), and receiving, through a reset terminal, the output signal from the output terminal of the second logic gate circuit (GAD in FIG. 9), and for outputting, from an output terminal, the read write identity signal (SRW).

In the semiconductor device according to the present invention, the mode judging unit (ADJ) may include: an address comparator (RCMP in FIG. 13) for comparing a read address stored in a read address register (RREG) to an address inputted into the address terminal in a read cycle; a first register (RA in FIG. 13) for receiving an output signal from the address comparator; a second register (RB in FIG. 13) for receiving an output from the first register; and a logic gate circuit (GA in FIG. 13) for receiving output signals from the first and second registers, and for outputting, as the mode entry signal, a logic-AND of the output signals from the first and second registers and a read write identity signal (SRW) from the read write judging unit, and wherein a pulse signal (SATD in FIG. 13) which is outputted at an address transition from an address transition detecting circuit for detecting an address transition is supplied as a sampling control signal to the first and second registers (RA and RB in FIG. 13).

In accordance with the present invention, a semiconductor device includes: a memory cell array (MARY in FIG. 1) comprising an array of plural memory cells; an address terminal (ADD in FIG. 1) for input of address; a data terminal (DQ in FIG. 1) for input and output of data; and an operation mode entry circuit (MOD in FIG. 1) for entry of an operation mode of a semiconductor memory. The operation mode entry circuit may be configured as follows. The operation mode entry circuit receives, as control signals, a first control signal (/CS in FIG. 1) inputted into a first control terminal and the first control signal being in an active state in a memory cycle for selecting a chip of the semiconductor memory; a second control signal (/OE in FIG. 1) inputted into a second control terminal and the first control signal being in an active state for controlling input and output of data through the data terminal and for outputting data; a third control signal (/WE in FIG. 1) inputted into a third control terminal and the first control signal being in an active state for a write operation. The operation mode entry circuit (MOD) includes: an address comparator (ACMP in FIG. 14) for receiving an input of an address inputted into the address terminal and an input of a predetermined address stored in a storage unit (AREG), and for comparing whether or not the two input addresses are identical with each other, and for outputting an output signal in an active state if an identity is detected; a pulse generating circuit (PG1 in FIG. 14) for generating one-shot pulse signal based on a transition to an active state of the first control signal(/CS); a first register (REG3 in FIG. 14) for sampling and outputting an output signal from the address comparator (ACMP) under a sampling control signal which is the pulse signal outputted from the pulse generating circuit (PG1 in FIG. 14); a second register (REG4 in FIG. 14) for sampling and outputting the second control signal under the pulse signal as a sampling control signal; a first logic gate circuit (AND1 in FIG. 14) for receiving an output signal from the first register, an output signal from the second register, and the pulse signal, and for outputting a result of a logical-AND of the three input signals as a sampling control signal (PRE in FIG. 14); a series connection of plural stage registers (REG1 and REG2 in FIG. 14) for commonly receiving the sampling control signal (PRE), wherein an output signal from the address comparator (ACMP) is inputted into a first stage register (REG 1 in FIG. 14) of the plural stage registers; a second logic gate circuit (NAND1 in FIG. 14) for receiving an output signal from the plural stage registers, and outputting an output signal in an active state if the output signal from the plural stage registers indicates an active state; an SR-flip-flop (NAND2 and NAND3 in FIG. 14) for receiving, through a set terminal, an output signal from the second logic gate circuit as a set signal, receiving, through a reset terminal, an output signal from the first register as a reset signal, and for outputting, from an output terminal, a mode entry signal (MENT in FIG. 14) which controls enabling of an operation mode entry; and a mode setting circuit (corresponding to registers REG6 and REG7, a mode selecting circuit MODSEL, a partial refresh switching signal generating circuit PEGEN, logic gate circuits AND2 and AND3 in FIG. 14) for receiving the mode entry signal from the SR-flip-flop, the output signal from the first register, and the third control signal, and for receiving and decoding data inputted into the data terminal in at least one write cycle, wherein an address inputted into the address terminal is identical with a predetermined address if the mode entry signal is in an active state, and for setting an operation mode based on a result of decoding.

In the semiconductor device according to the present invention, the mode setting circuit includes: a third register (REG5 in FIG. 14) for sampling the third control signal based on the pulse signal; a third logic gate circuit (AND2 in FIG. 14) for generating a second sampling control signal (WRE1) based on the pulse signal if the output signal from the first register (REG3 in FIG. 14) is in an active state and the output signal from the third register (REG5 in FIG. 14) is in an active state; a fourth register (REG6 in FIG. 14) for sampling and outputting data from the data terminal based on the second sampling control signal (WRE1) from the third logic gate circuit; a mode selecting circuit (MODSEL in FIG. 14) for mode selection based on an output signal from the fourth register; a fourth logic gate circuit (AND3 in FIG. 14) for receiving the pulse signal and generating a third sampling control signal (WRE2) if an output signal from the mode selecting circuit; a fifth register (REG7 in FIG. 14) for sampling and outputting data from the data terminal based on the third sampling control signal (WRE2); and a switching signal generating circuit (PEGEN) for outputting a switching signal for switching operations based on an output signal from the fifth register.

The semiconductor device according to the present invention may further include: a refresh control circuit (RSH in FIG. 1) for generating a refresh address for automatic refresh if a timeout appears in a timer counting a time, and wherein the operation switching signal is used as a signal for masking a predetermined higher significant bit of the generated refresh address, and a refresh area varies based on the operation switching signal from the operation mode entry circuit.

In the semiconductor device according to the present invention, the semiconductor memory comprises a pseudo SRAM (static random access memory) which comprises a dynamic semiconductor memory with a self-refresh function, and wherein the first to third control signals comprise a chip select signal (/CS) for SRAM, an output enable signal (/OE) and a write enable signal (/WE) respectively.

In the semiconductor device according to the present invention, the mode setting unit (CDE) may be configured so that mode data are generated and outputted based on signals supplied to the address terminal and/or a predetermined control terminal, instead of the data terminal, in at least one write cycle following to the continuous plural read cycles, if the mode entry signal (MENT) is an active state.

In the semiconductor device according to the present invention, the mode setting unit (CDE) may set the mode entry signal (MENT) to be active state under other conditions than when read cycles are continued for a predetermined address. The other conditions may include a detection of:

plural cycles which comprises a read cycle for a predetermined address and a write cycle for the predetermined address following to this read cycle;

plural cycles which comprises a write cycle for a predetermined address and a read cycle for the predetermined address following to this read cycle; or continuous write cycles for a predetermined address.

BRIEF DESCRIPTION OF DRAWINGS

FIG. 4 is a view describing a configuration of command data in accordance with the first embodiment of the present invention.

BEST MODE FOR CARRYING OUT THE INVENTION

Embodiments of the present invention will be described with reference to drawings.

(Embodiment 1)

Figure 1:
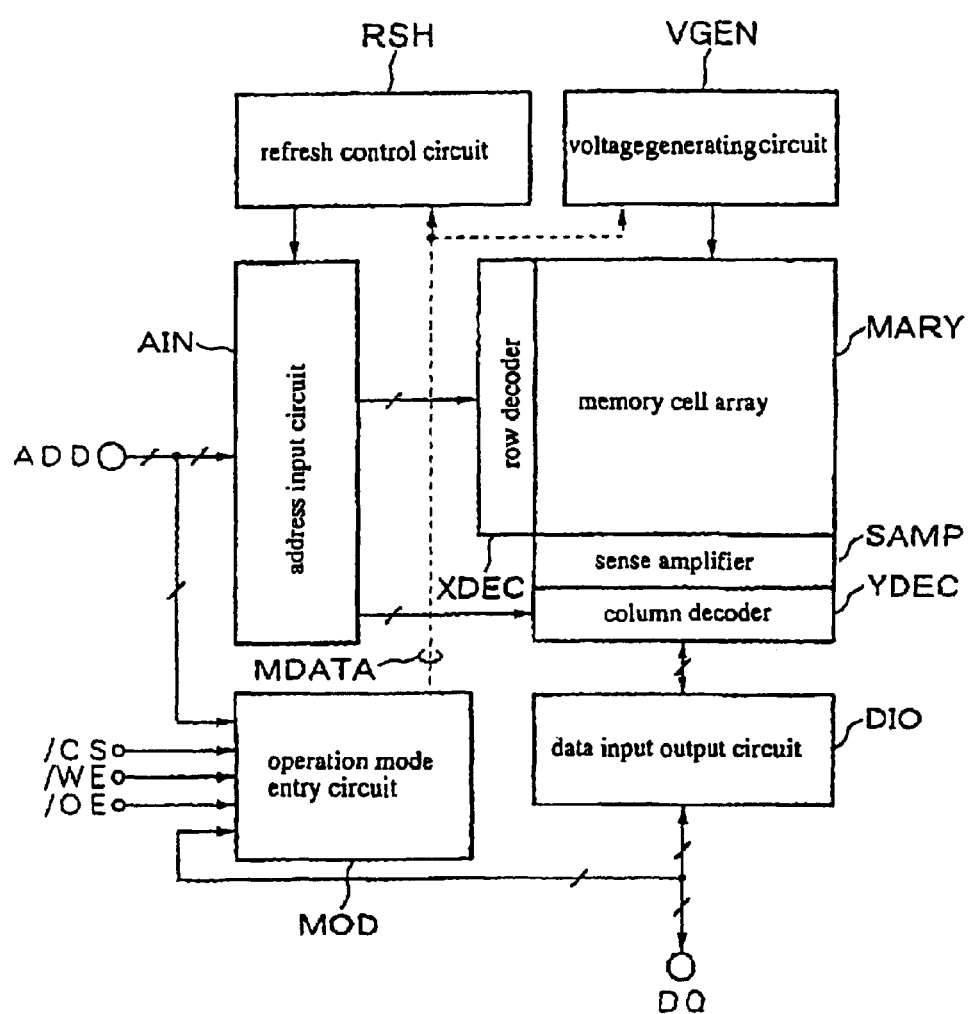
FIG. 1 is a block diagram illustrative schematically of an entire configuration of a semiconductor memory in accordance with the first embodiment of the present invention.

FIG. 1 is illustrative schematically of an entire configuration of a semiconductor memory in accordance with the first embodiment of the present invention. This semiconductor memory is one kind of non-synchronous pseudo SRAM based on dynamic RAM and is configured to enable an operation mode entry according to command data during operation. Notwithstanding, this invention should not be limited to the pseudo SRAM and may be applicable to any non-synchronous memory devices.

In FIG. 1, an address input circuit AIN is to fetch an address ADD from outside. A memory cell array MARY comprises a matrix array of dynamic memory cells. In this memory cell array MARY, word lines and bit lines are routed in the form of rows and columns. A row decoder XDEC selects a row of the memory cell array MARY based on a row address fetched by the address input circuit AIN.

A sense amplifier SAMP amplifies data signals appearing on bit lines in the memory cell array MARY. A column decoder YDEC selects a column of the memory cell array MARY based on a column address fetched by the address input circuit AIN. Subjected to read is corresponding one of data signals amplified by the sense amplifier SAMP to a column selected by the column decoder YDEC. A data input output circuit DIO is to input and output data DQ.

A refresh control circuit RSH performs sequential controls for designating a memory cell array to be selected for refresh. A voltage generating circuit VGEN generates a variety of internal voltages, and has a function of generating a boosted voltage for driving a word line, a function of generating a substrate voltage which provides a bias to a substrate of the memory cell array, and a function of generating a refresh voltage to be referred by the sense amplifier in amplifying data signal.

An operation mode entry circuit MOD is a feature of the present invention and enters an operation mode designated by command data and mode data MDATA to be used for changing functions of various circuit blocks such as the above-described refresh control circuit in accordance with the contents of the operation mode. This operation mode entry circuit MOD stores a final address "1FFFFFh" (h: hexadecimal) and a top address "000000h". This operation mode entry circuit MOD is configured to accept a request for an operation mode entry if read cycles for the final address are continued and to decide an operation mode to be entered based on data designated by a write cycle following to those read cycles.

In FIG. 1, a chip select signal /CS is an external control signal for controlling this semiconductor memory in a stand-by state. An output enable signal /OE is to control an output impedance state of the data input output circuit DIO. A write enable signal /WE is to switch a write operation and a read operation.

Figure 2:
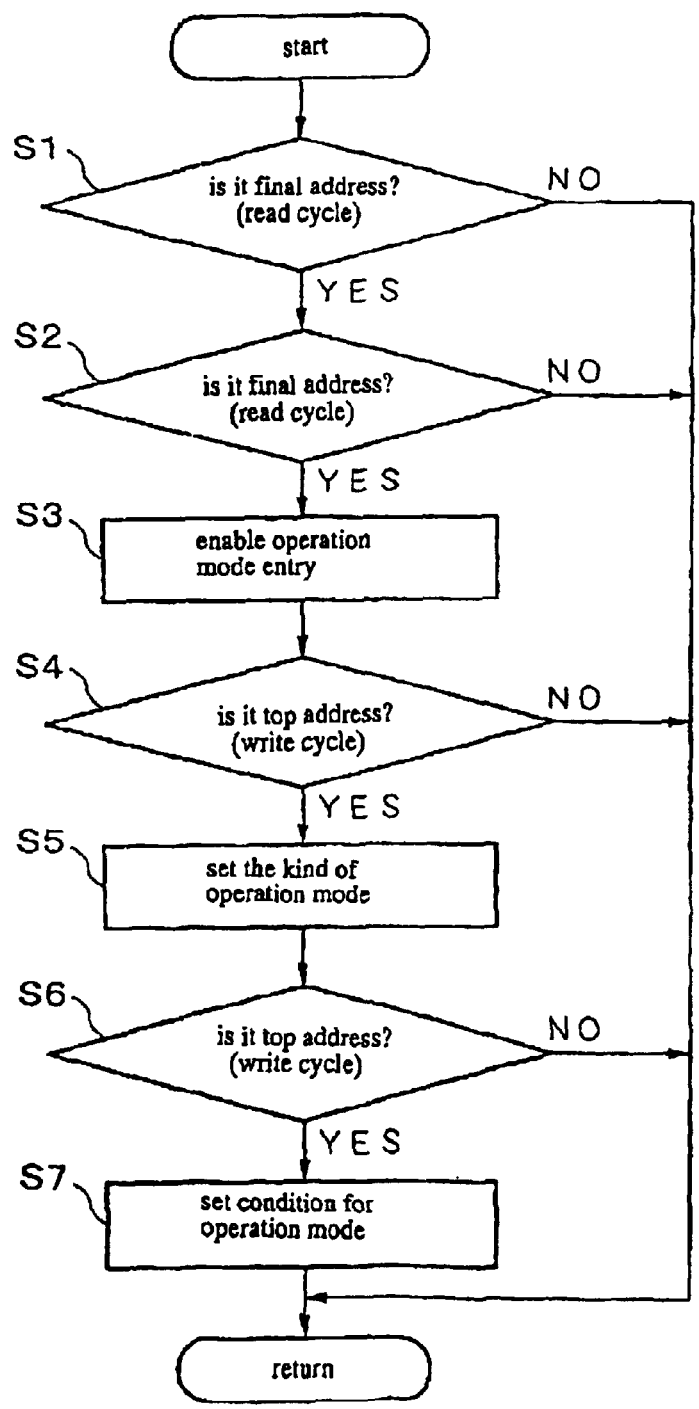
FIG. 2 is flow chart illustrative of operations of an operation mode entry circuit in accordance with the first embodiment of the present invention.
Figure 3:
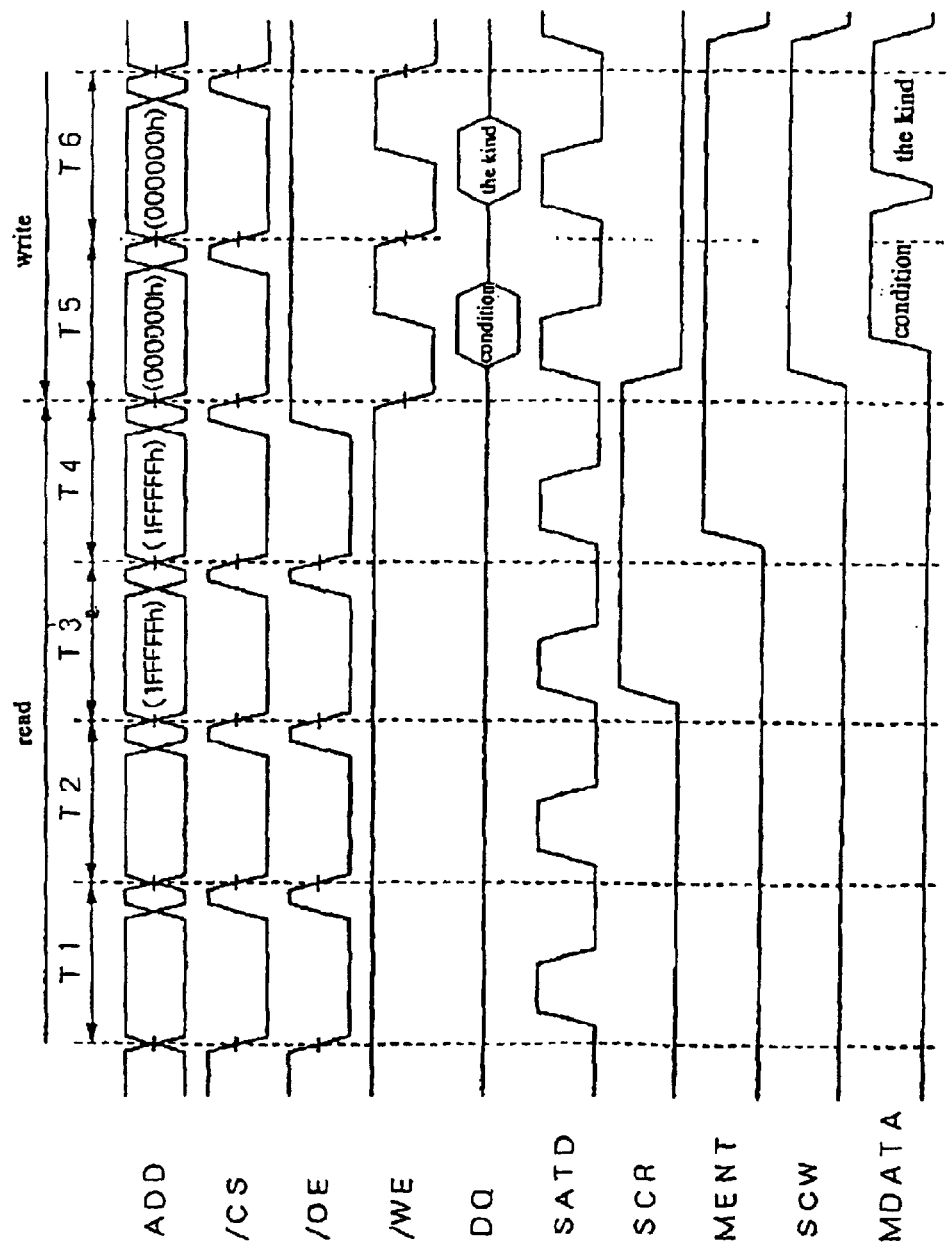
FIG. 3 is a timing chart describing operations of an operation mode entry circuit in accordance with the first embodiment of the present invention.

An operation (an operation mode entry method) of the operation mode entry circuit MOD shown in FIG. 1 will be described along the flow shown in FIG. 2 and with reference to the timing chart of FIG. 3, wherein a partial refresh mode is entered. FIG. 2 is a flow chart showing flows of operations for entry of the operation mode, and FIG. 3 is a timing chart of signals related to the operation mode entry.

The operation mode entry circuit MOD compares an external address ADD to the final address "1FFFFFh" and judges whether or not the externally designated address ADD is the final address in every cycles (step S1). In an example shown in FIG. 3, in read cycles T1 and T2, the external address ADD is not the final address, and thus the address ADD is not identical with the final address. In this case, this judgement process will be repeated until an external address ADD identical with the final address is designated (step S1: NO).

In a read cycle T3, the final address "1FFFFFh" is designated as the external address ADD, and thus the external address ADD is identical with the final address. The operation mode entry circuit MOD judges that the external address ADD is the final address (step S1: YES). In the next read cycle T4, if the final address is designated as the external address ADD (step S2: YES), then the operation mode entry is enabled (step S3). Namely, the operation mode entry is enabled under conditions that the read cycles are continued for the final address as the specific address, and the request for the operation mode entry is accepted. Assuming that in the read cycle T4, the final address is not designated, the process will be back to the above-described step S1 and the same processes will then be repeated. As described above, the request for the operation mode entry is accepted.

In a subsequent write cycle T5, a top address is designated externally as the external address ADD, and command data for designating the kind of the operation mode to be entered are designated as data DQ. As shown in FIG. 4(a), as the kinds of the operation mode to be entered, there are a partial refresh mode, a page length setting mode, and a test mode. The kind of the operation mode is designated by two-bits data as data DQ applied to data terminals I/O1 and I/O2 in the write cycle T5. Since the partial refresh mode is subjected to the entry, then data "0" are externally applied to the data terminals I/O1 and I/O2 respectively in accordance with the example shown in FIG. 4(a).

In FIG. 3, a detecting signal SCW is to detect the top address in the write cycle, a detecting signal SCR is to detect the final address in the read cycle and are generated inside of the operation mode entry circuit MOD. This signal will be described in details later.

In this write cycle T5, the operation mode entry circuit MOD judges whether or not the externally designated address ADD is the top address (step S4). If it is the top address, then the operation mode entry circuit MOD sets a kind of the operation mode based on data DQ designated as the above-described command data (step S5). The operation mode entry circuit MOD outputs mode data MDATA which designate the partial refresh mode as the operation mode to be set. Assuming that the top address is not designated (step S4: NO), then the processes will be back to the above-described step S1 and the above-described sequential steps will be repeated.

After the partial refresh mode is designated as the operation mode in the above-described write cycle T5, then in a subsequent write cycle T6, the operation mode entry circuit MOD compares the addresses similarly to the above-described step S4. In this write cycle T6, if the top address is designated as the external address ADD, then the operation mode entry circuit MOD sets a scale of a storage area to be refreshed or a scale of a memory cell array to be refreshed as detailed conditions for the partial refresh mode. In contrast, if the top address is not designated in the write cycle T6 (step S6: NO), then the operation mode entry circuit MOD will back the process to the above-described step S1 and repeat the above-described sequential steps. As described above, the operation mode to be entered is decided. Thereafter, the semiconductor memory operates in the partial refresh mode.

FIG. 4(b) shows a scale of a storage area which is allowed to be designated as detailed conditions for the partial refresh mode. Command data for designating these detailed conditions are designated by two-bits data as data DQ applied to data terminals I/O1 and I/O2 in the write cycle T6. In an example shown in FIG. 4(b), if the two-bits data applied to the data terminals I/O1 and I/O2 are "0, 0", then a storage area corresponding to 16 megabits is designated. If the two-bits data applied to the data terminals I/O1 and I/O2 are "1, 0", then a storage area corresponding to 8 megabits is designated. If the two-bits data applied to the data terminals I/O1 and I/O2 are "0, 1", then a storage area corresponding to 4 megabits is designated. If the two-bits data applied to the data terminals I/O1 and I/O2 are "1, 1", then there is absent any storage area to be refreshed, and thus no refresh is carried out and no data are held.

If the page length setting mode is designated as the operation mode, the a word number which represents the page length is designated as command data (data DQ) for data indicating the conditions of the operation mode as shown in FIG. 4(c). In an example shown in FIG. 4(c), the page length is designated by single bit data applied to a data terminal I/O3. If data applied to the data terminal I/O3 is "0", then the page length is 4-words. If data applied to the data terminal I/O3 is "1", then the page length is 8-words.

Figure 5:
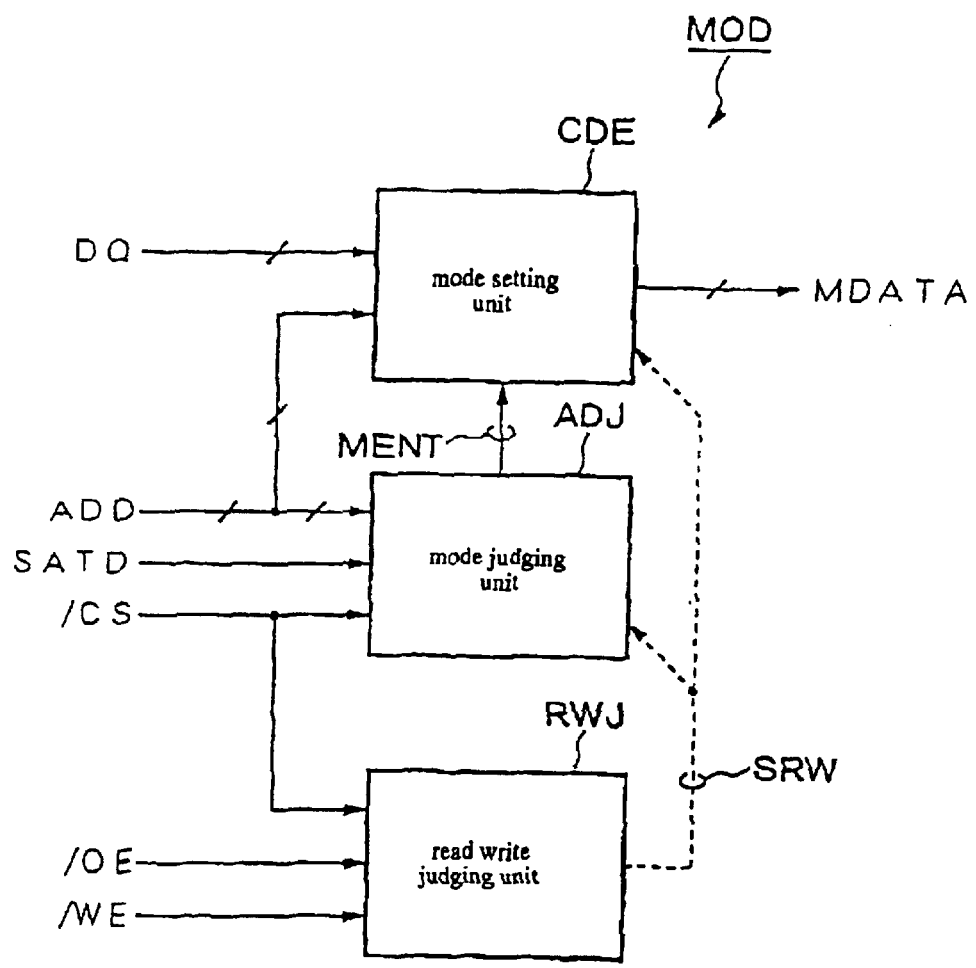
FIG. 5 is a block diagram illustrative of a configuration of an operation mode entry circuit in accordance with the first embodiment of the present invention.

Subsequently, the operation mode entry circuit MOD will be described in details. FIG. 5 shows a schematic configuration of the operation mode entry circuit MOD. In FIG. 5, a read write judging unit RWJ judges whether the current cycle is the read cycle or the write cycle based on the output enable signal /OE and the write enable signal /WE, and outputs a read write identity signal SRW. A mode judging unit ADJ judges whether the request for entry is present or absent based on the address ADD designated in the read cycle., and output a mode entry signal MENT. A mode setting unit CDE generates and outputs mode data MDATA based on the data DQ if the request for entry is present, wherein the data DQ are supplied externally as the command data.

In FIG. 5, a pulse signal SATD is generated upon detection of a transition of the address ADD by an address transition detecting circuit (ATD) which is not illustrated.

Figure 6:
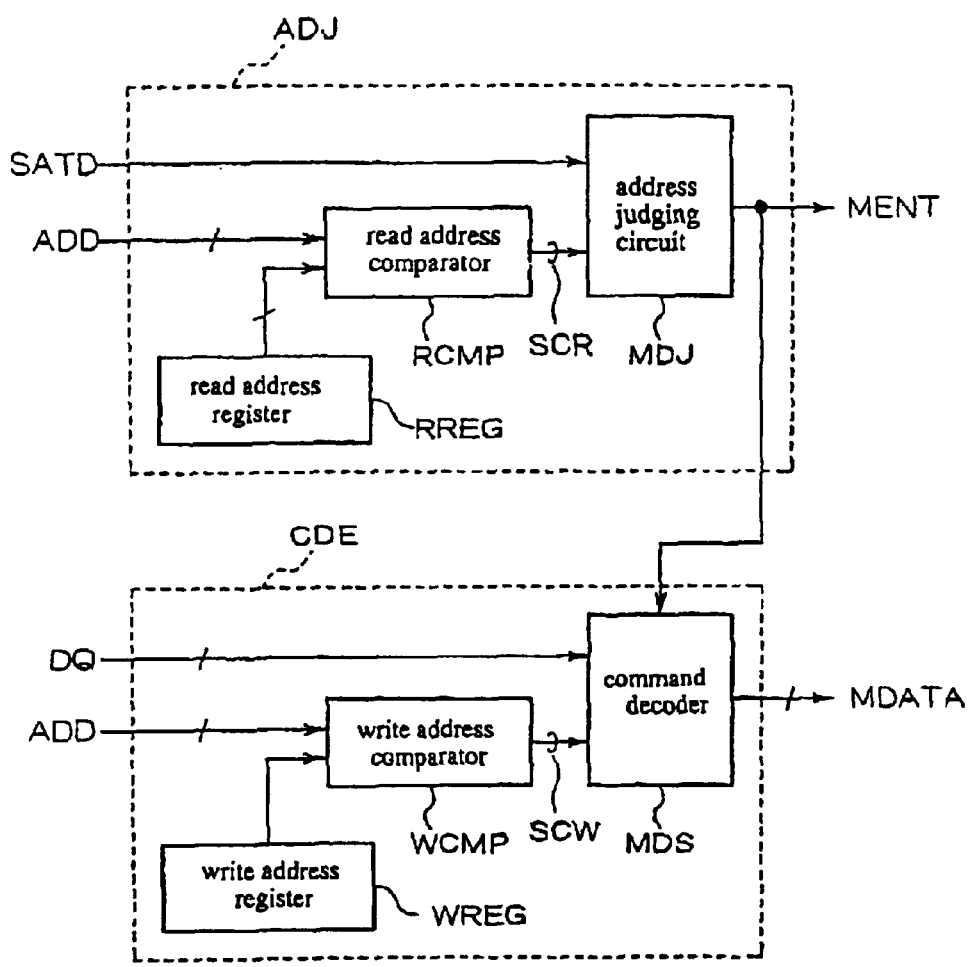
FIG. 6 is a block diagram illustrative of a detailed configuration of a main part of an operation mode entry circuit in accordance with the first embodiment of the present invention.

FIG. 6 shows an example of configurations of the mode judging unit ADJ and the mode setting unit CDE. In FIG. 6, a read address register RREG stores the final address. A read address comparator RCMP compares the final address to the external address ADD, and outputs an address detecting signal SCR if the identity between the externally entered address ADD and the final address is detected. An address judging circuit MDJ receives the pulse signal SATD and the address detecting signal SCR, and judges whether or not read cycles are continued for the final address.

A write address register WREG stores the top address. A write address comparator WCMP compares the top address to the external address ADD. Those are similar to the above-described read address register RREG and the read address comparator RCMP, except that the top address is detected and the address detecting signal SCW is outputted. A command decoder MDS receives the external data DQ and the address detecting signal SCW and generates the mode data MDATA.

Figure 7:
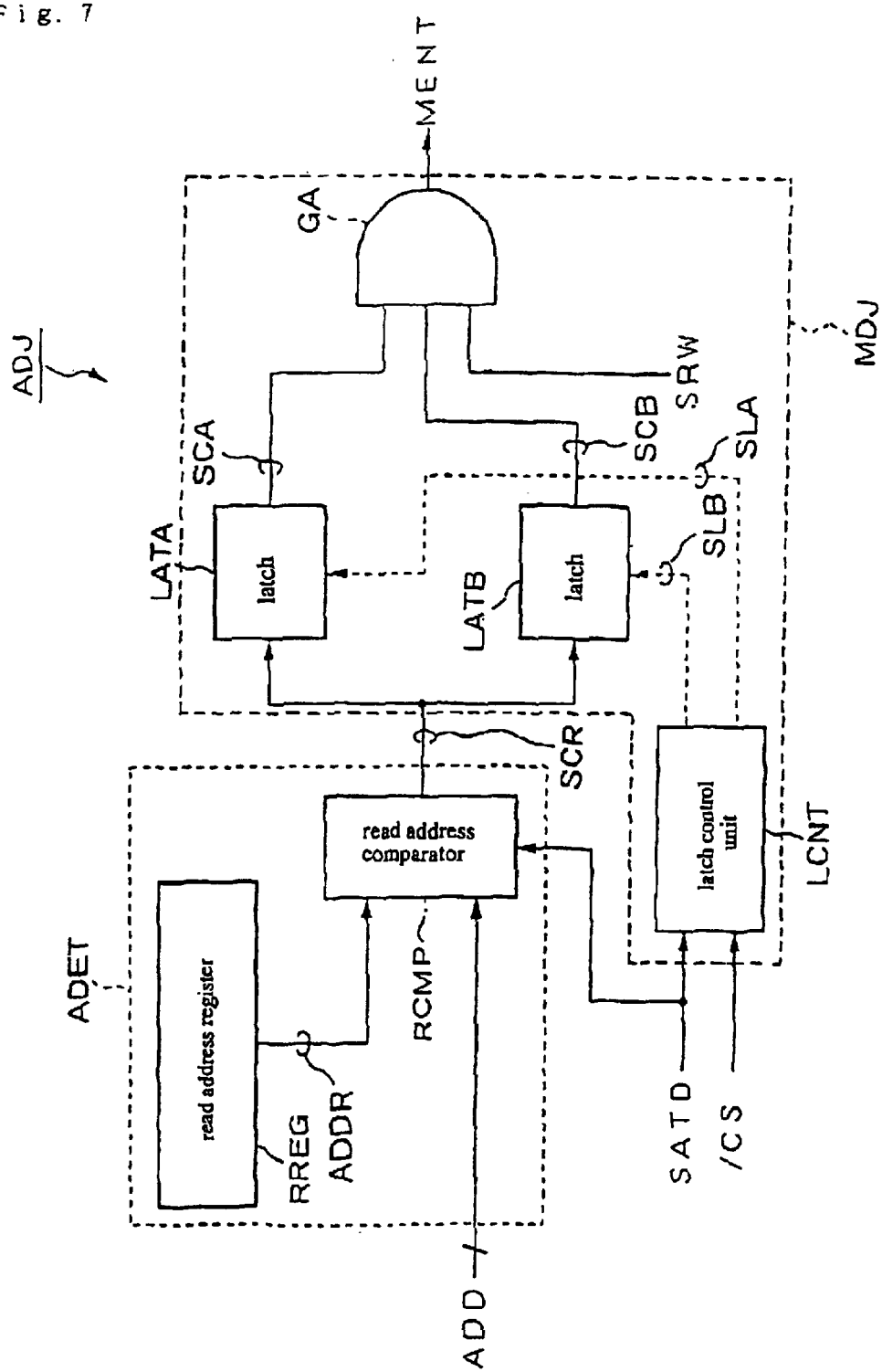
FIG. 7 is a circuit diagram illustrative of an example of a configuration of a mode judging unit in an operation mode entry circuit in accordance with the first embodiment of the present invention.

FIG. 7 shows a detailed example of the configuration of the mode judging unit ADJ. In FIG. 7, an address detecting unit ADET detects a specific address ADDR (hereinafter referred to as a specific read address) to be designated externally in a read cycle for the operation mode entry. This address detecting unit ADET comprises a read address register RREG and a read address comparator RCMP. The read address register RREG stores the final address as the specific read address ADDR. The read address comparator RCMP compares the specific read address ADDR stored in the read address register RREG to the address ADD designated sequentially and externally, and outputs an address detecting signal SCR if they are identical with each other.

Latches LATA and LATB latch the address detecting signal SCR based on latch signals SLA and SLB and output address detecting signals SCA and SCB, respectively. A logic-AND gate GA operates a logical-AND of the address detecting signals SCA and SCB, and outputs a result of the operation as the mode entry signal MENT. A latch control unit LCNT controls operations of the above-described latches LATA and LATB. The latches LATA and LATB, the logic-AND gate GA, and the latch control unit LCNT perform as the address judging circuit MDJ which receives the address detecting signal SCR and judges that at least two read cycles are continued for the specific read address ADDR.

Figure 8:
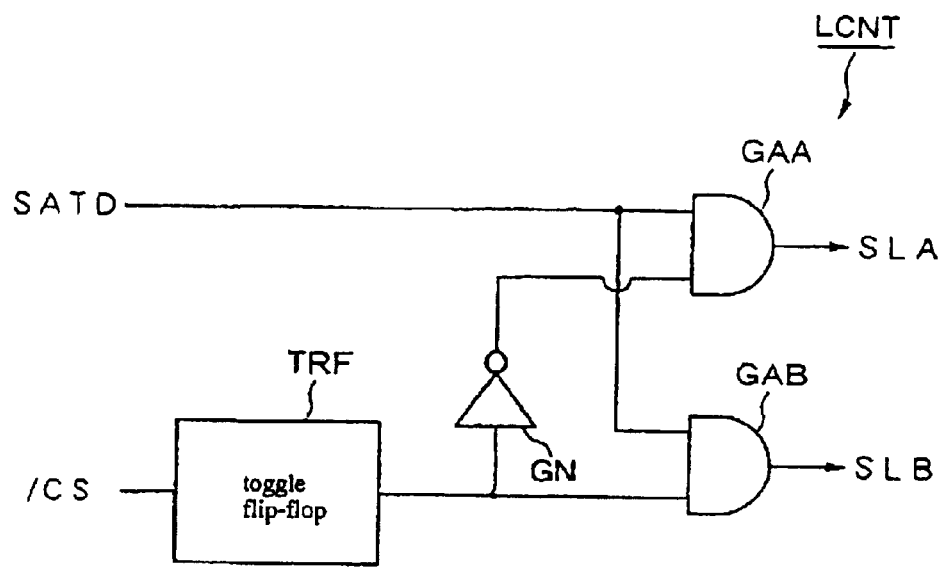
FIG. 8 is a circuit diagram illustrative of an example of a configuration of a latch control unit in a mode judging unit in accordance with the first embodiment of the present invention.

FIG. 8 shows an example of the configuration of the latch control unit LCNT. In FIG. 8, a toggle flip-flop (T-FF) TRF inverts the output signal by triggering a negative edge of the chip select signal /CS. An inverter GN outputs an inverted signal from the output signal from the toggle flip-flop TRF. There are logic-AND gates GAA, GAB. The logic-AND gate GAA receives the pulse signal SATD and the output signal from the inverter GN, and outputs the latch signal SLA. The logic-AND gate GAB receives the pulse signal SATD and the output signal from the toggle flip-flop TRF, and outputs the latch signals SLA and SLB. The latch control unit LCNT causes alternating appearances of the pulse signal SATD and the latch signal SLA or SLB by triggering the negative edge of the chip select signal /CS.

Figure 9:
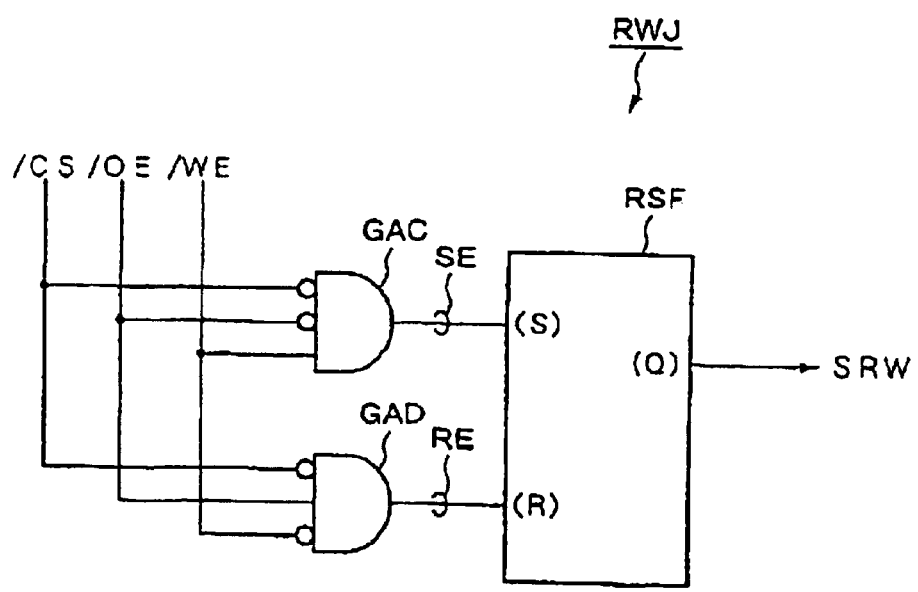
FIG. 9 is a circuit diagram illustrative of an example of a configuration of a read write judging unit in an operation mode entry circuit in accordance with the first embodiment of the present invention.

FIG. 9 shows an example of the configuration of the read write judging unit RWJ shown in FIG. 5. In FIG. 9, logic-AND gates GAC and GAD are provided. The logic-AND gate GAC receives inversion inputs of the chip select signal /CS and the output enable signal /OE, and an input of the write enable signal /WE. The logic-AND gate GAD receives inversion inputs of the chip select signal /CS and the write enable signal /WE, and an input of the output enable signal /OE. A reset-set-flip-flop (RS-FF) RSF receives, at an S-terminal, a set signal SE from the logic-AND gate GAC, and also receives, at an R-terminal, a reset signal RE from the logic-AND gate GAD, and outputs, from a Q-terminal, a read write identity signal SRW. This read write judging unit RWJ causes that the read write identity signal SRW to be high level in the read cycle and to be low level in the write cycle.

Figure 10:
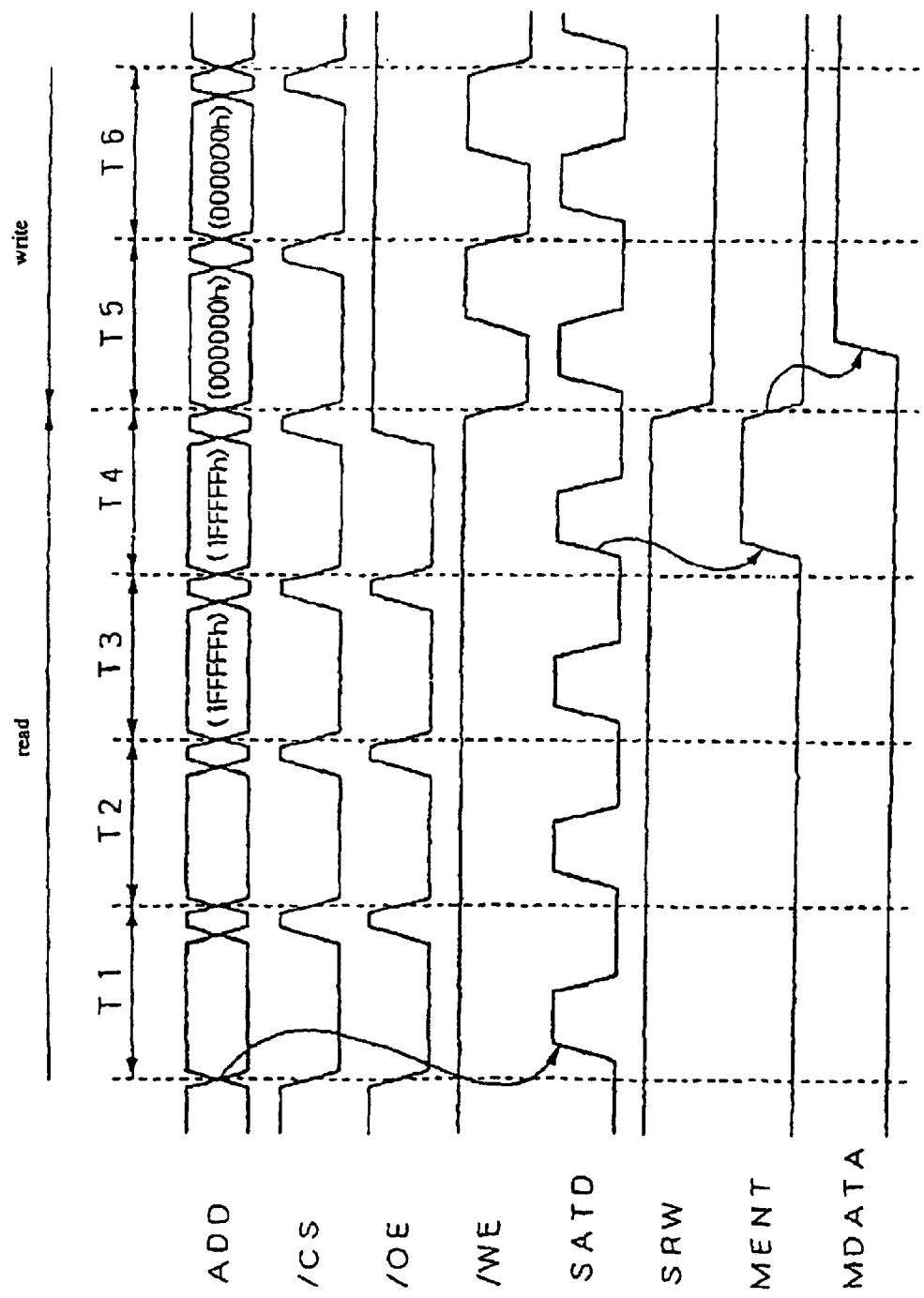
FIG. 10 is a timing chart schematically describing operations of an operation mode entry circuit in accordance with the first embodiment of the present invention.
Figure 11:
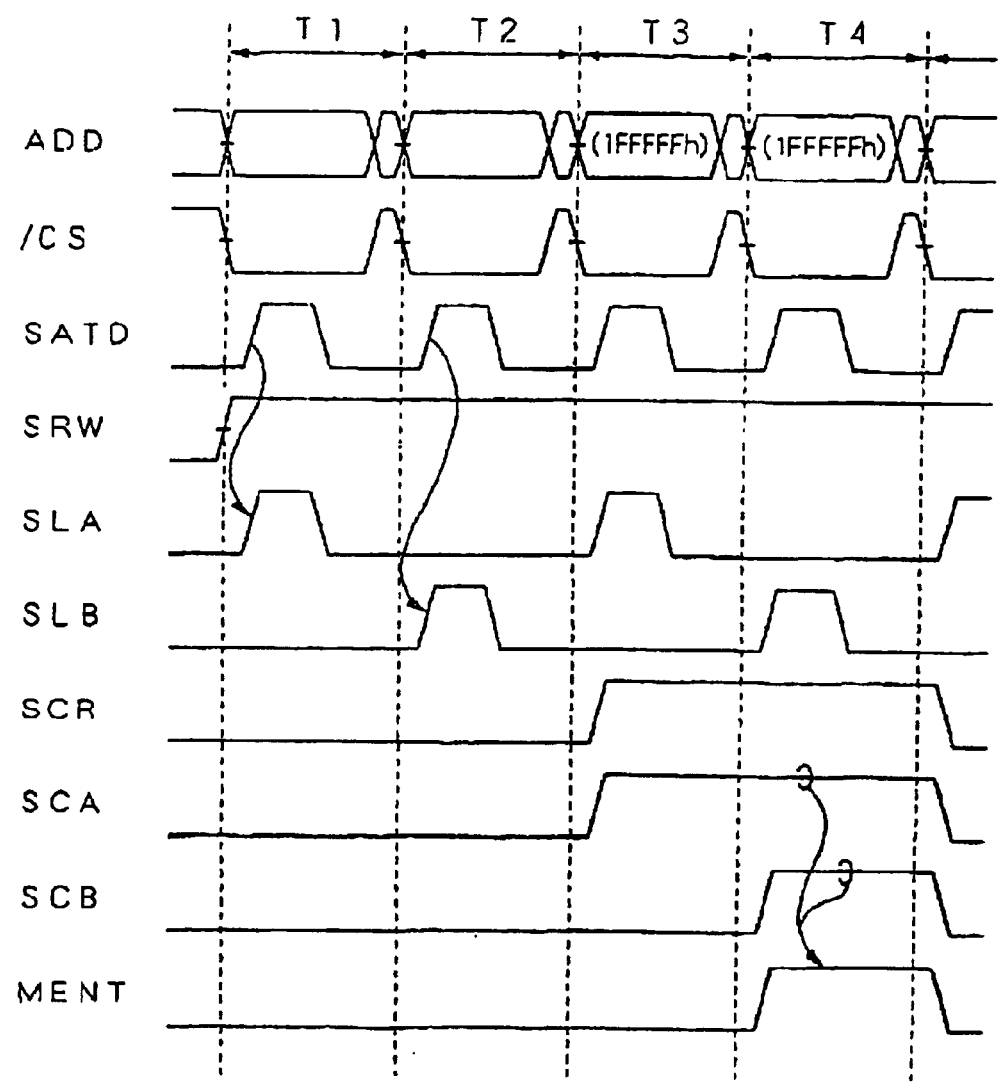
FIG. 11 is a timing chart schematically describing operations of a mode judging unit in accordance with the first embodiment of the present invention.
Figure 12:
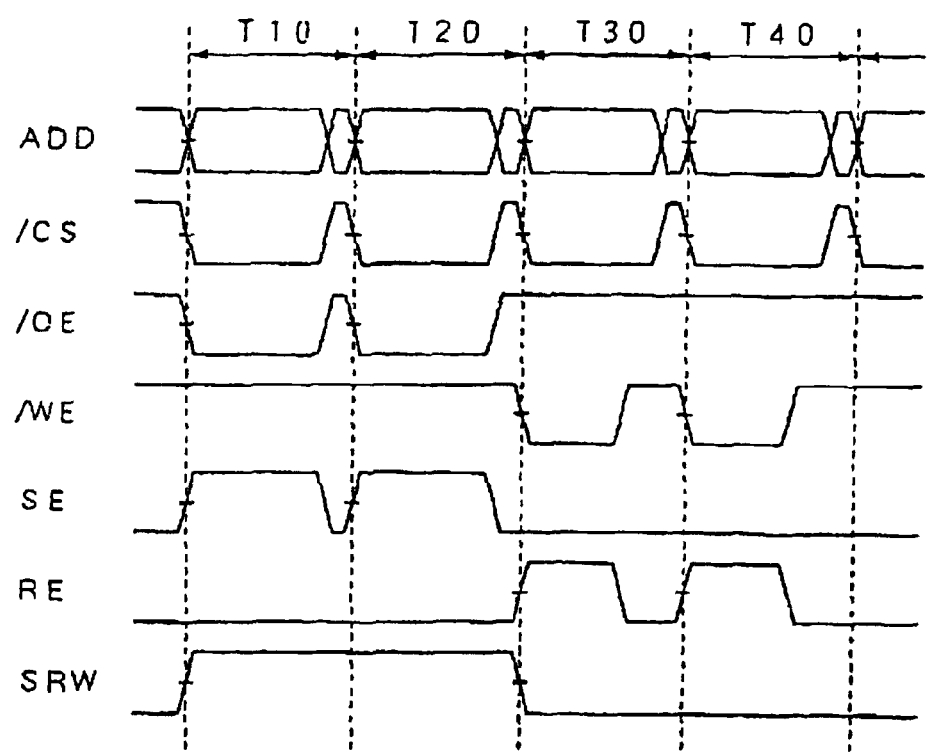
FIG. 12 is a timing chart schematically describing operations of a read write judging unit in accordance with the first embodiment of the present invention.

Operations of the operation mode entry circuit MOD shown in FIGS. 5 through 9 in this embodiment will subsequently be described with reference to the timing charts shown in FIGS. 10 through 12. FIG. 10 is a timing chart describing operations of the operation mode entry circuit MOD shown in FIG. 5. FIG. 11 is a timing chart describing operations of the mode judging unit ADJ shown in FIGS. 6–8. FIG. 12 is a timing chart describing operations of the read write judging unit RWJ shown in FIG. 9.

The operation of the operation mode entry circuit MOD shown in FIG. 5 will schematically be described with reference to FIG. 10. In the read operation, the write enable signal /WE is held in the high level, and the chip select signal /CS and the output enable signal /OE are set in the low level in synchronizing with the operation cycle. The address ADD is designated in every cycles. If the address ADD is transitioned when the cycle is switched, then the transition of this address ADD is detected by an address transition detecting circuit not illustrated and the pulse signal SATD is generated.

The read write judging unit RWJ outputs of the high level of the read write identity signal SRW in the read cycles T1~T4 and then outputs the low level of the read write identity signal SRW in the subsequent write cycles T5 and T6. The mode judging unit ADJ judges that the request for the operation mode entry has been made, if the read accesses for the final address are continued in the two cycles in a period of time, wherein the read write identity signal SRW is in the high level. The mode judging unit ADJ outputs the high level of the mode entry signal MENT upon receipt of the request. In the example shown in FIG. 10, the read cycles for the final address "1FFFFFh" are continued in the cycles T3 and T4, and in these cycles, the mode entry signal MENT is in the high level.

Subsequently, the mode setting unit CDE generates the mode data MDATA based on the external data DQ if the read write identity signal SRW is in the high level in the above-described read cycle T4, and in the write cycles T5 and T6 following to the read cycle T4, the top address "000000h" is designated as the address ADD. In this case, the data input output circuit DIO is inactivated and the output of the read data are inhibited.

The mode data MDATA are a set of data which are necessary for re-routine of signal paths in an internal circuit of the semiconductor memory in accordance with the operation mode to be entered. The mode data MDATA have previously been prepared according to the operation mode. Upon output of the mode data MDATA, a state of the internal circuit of the semiconductor memory is switched for enabling operations in the entered operation mode, namely for deciding the entered operation mode.

In the example shown in FIG. 10, in the first write cycle T5, the kind of the operation mode is decided. In the next write cycle T6, the detailed conditions for the operation mode are decided. The kind and the detailed conditions of the operation mode are set according to the above-described example shown in FIG. 4. For example, assuming that the operation mode to be entered is a partial refresh mode for a storage area of 4-megabits, in the first write cycle, data are designated as data DQ, which specify the "partial refresh mode" as the kind of the operation mode. In the subsequent write cycle T6, other data are designated as data DQ, which specify the scale of the storage area to be refreshed, whereby the operation mode to be entered is decided and the mode data MDATA according to this operation mode are generated.

The semiconductor memory in accordance with the present invention is a non-synchronous memory in view of its performance, and thus does not need any external synchronizing signal for the normal operations such as the data write operation and the data read operation based on the chip select signal /CS and the address ADD.

The semiconductor memory in accordance with the present invention is to set the operation mode if the same address is designated in the continuous cycles. The semiconductor memory is configured to change the chip select signal /CS for every cycles and to use the chip select signal /CS as a synchronizing signal for effectively preventing any erroneous entry.

Operations of the mode judging unit ADJ shown in FIGS. 7 and 8 will be described with reference to FIG. 11. The mode judging unit ADJ outputs the mode entry signal MENT if the final address "1FFFFFh" is designated continuously in the two cycles.

For application of power, an initial stable state of the toggle flip-flop TRF shown in FIG. 8 is decided. In this example, it is assumed that in the initial state, the latch signal SLA is in the high level and the latch signal SLB is in the low level. After a read cycle T1 is commenced, the read write judging unit RWJ operates to output the high level of the read write identity signal SRW to be described below.

The logic-AND gate GA shown in FIG. 7 is activated upon receipt of the read write identity signal SRW, and outputs the mode entry signal MENT in accordance with a combination of the address detecting signals SCA and SCB. Also, the latch control unit LCNT operates to output the latch signals SLA and SLB alternatively for every read cycles.

The read address comparator RCMP constituting the address detecting unit ADET compares the externally designated address ADD to the final address "1FFFFFh" stored as the specific read address ADDR in the read address register RREG. If an identity between them is detected, the read address comparator RCMP outputs the high level of the address detecting signal SCR. In the example shown in FIG. 11, the external address ADD is identical with the final address in the read cycles T3 and T4, whereby the high level of the address detecting signal SCR is outputted.

The address detecting signal SCR is fetched into any one of the latches LATA and LATB based on the latch signals SLA and SLB. As shown in FIG. 11, in the read cycle T3, the latch signal SLA is in the high level, whereby the address detecting signal SCR is fetched into the latch LATA, and then outputted as the address detecting signal SCA. In the previous read cycle T2, the latch LATB has already obtained the low level of the address detecting signal SCR, for which reason in the read cycle T3, the latch LATB outputs the low level of the address detecting signal SCB. Therefore, the logic gate GA, which have received the address detecting signals SCA and SCB, will output the low level of the mode entry signal MENT.

In the subsequent write cycle T4, the latch LATB is placed into the high level, whereby the address detecting signal SCR is fetched into the other latch LATB, and then outputted as the address detecting signal SCB. At this time, the external address ADD remains to be the final address "1FFFFFh", for which reason the address detecting signal SCR is kept in the high level. Since the latch LATA has obtained the high level in the read cycle T3, then in the write cycle T4, the address detecting signal SCB is held in the high level. Thus, the logic gate GA outputs the high level of the mode entry signal MENT.

As described above, the high level of the mode entry signal MENT is outputted if the final address "1FFFFFh" is continuously designated in the two cycles. This signal makes it possible to confirm the request for the entry.

Operations of the read write judging unit RWJ shown in FIG. 9 will be described with reference to FIG. 12. The read write judging unit RWJ identifies the read cycle (the read operation) and the write cycle (the write operation) from the combinations of the chip select signal /CS, the output enable signal /OE, and the write enable signal /WE.

As shown in FIG. 12, if the cycles T10 and T20 are read cycles, then the logic-AND gate GAC outputs the high level of the set signal SE in those cycles. In this case, the logic-AND gate GAD keeps the low level of the reset signal RE, for which reason the set-rest flip-flop RSF outputs the high level of the read write identity signal SRW.

If the cycles T30 and T40 are the write cycles, then the logic-AND gate GAD outputs the high level of the reset signal RSE in those cycles. In this case, the logic-AND gate GAC keeps the low level of the set signal SE, for which reason the set-rest flip-flop RSF outputs the low level of the read write identity signal SRW. The read write identity signal SRW is kept in the high level if the read cycles are continued, and is kept in the low level if the write cycles are continued. Accordingly, the read cycle and the write cycle can be identified based on the read write identity signal SRW.

As described above, the operation mode entry of the semiconductor memory of the first embodiment has been completed. Thereafter, the semiconductor memory operates in the operation mode as entered.

The summery of the above-described operations are as follows.

(1) The read write judging unit RWJ judges whether the current cycle is the read cycle or the write cycle, and outputs the read write identity signal SRW which identifies the read or write cycle.

(2) If the current cycle is the read cycle, then the mode judging unit ADJ judges whether or not the externally entered address ADD is identical with the final address in each cycle and outputs the mode entry signal MENT if the read cycles for the final address are continued.

(3) The mode setting unit CDE decodes the externally designated data DQ upon input of the mode entry signal MENT and generates the mode data MDATA if the current cycle is the write cycle and the external address is identical with the top address.

In accordance with the first embodiment, it is possible that the timing specification of the read cycle and the write cycle are the same as the normal timing specification, for which reason it is unnecessary to prepare any specific or unique timing specification for the system side who uses the semiconductor memory. Accordingly, the operation mode entry can be made without making the timing design complicated.

If the same specific address is continued in the plural read cycles, then the operation mode entry is accepted so as to effectively prevent the erroneous entry.

Further, the operation mode entry is enabled if the two read accesses to the final address are continued, even the final address has less frequency in use for the normal applications, thereby to minimize the restriction to the address space over the applications.

(Embodiment 2)

The second embodiment of the present invention will be described.

Figure 13:
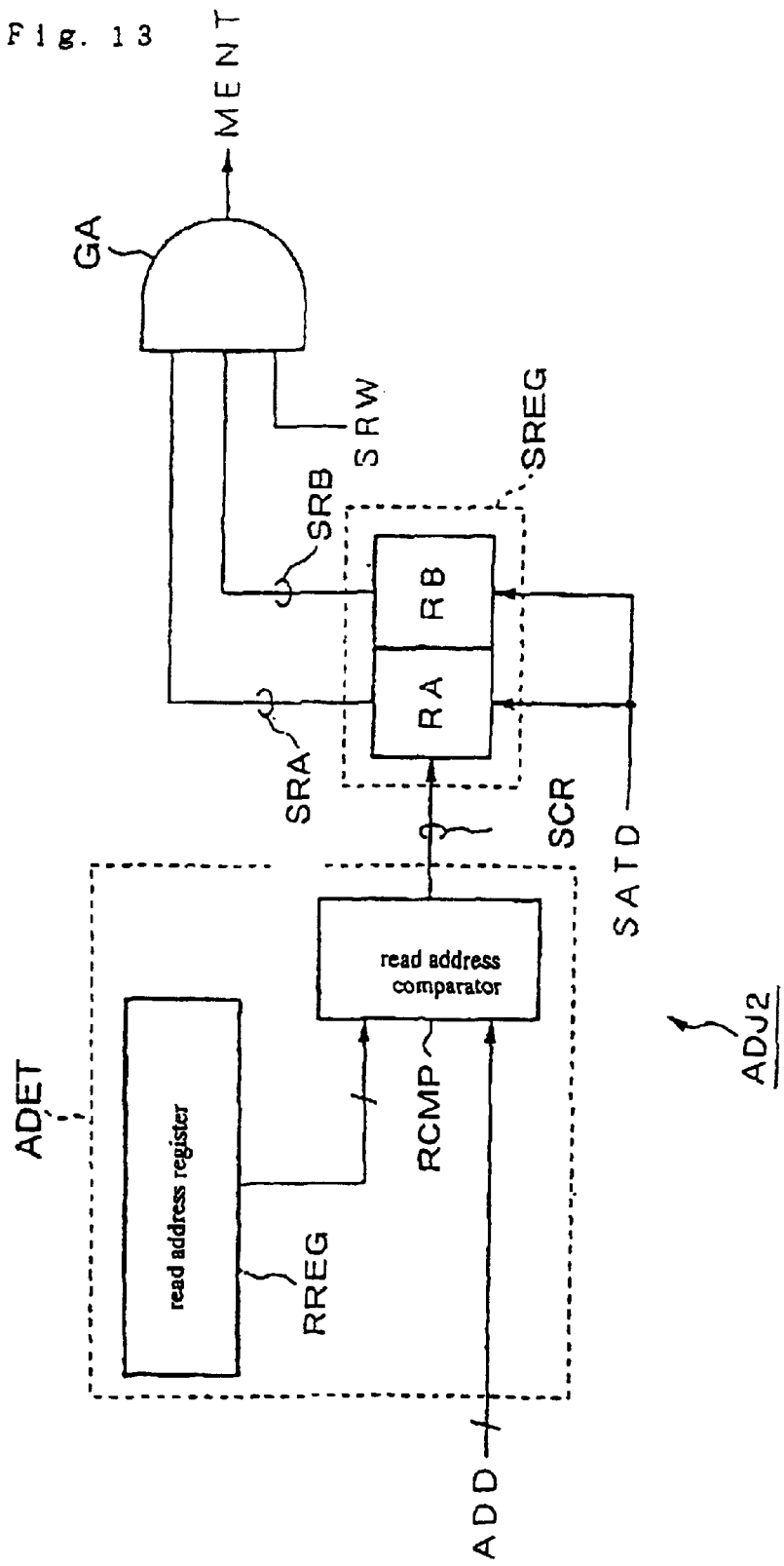
FIG. 13 is a circuit diagram illustrative of an example of a configuration of a mode judging unit in accordance with the second embodiment of the present invention.

In accordance with this second embodiment, a mode judging unit ADJ2 shown in FIG. 13 is provided instead of the mode judging unit ADJ shown in FIG. 5. The mode judging unit ADJ2 includes a shift register SREG instead of the latches LATA and LTAB and the latch control circuit LCNT included in the mode judging unit ADJ shown in FIG. 7. This shift register SREG comprises a register RA and a register RB.

In the second embodiment, the shift register SREG takes an address detecting signal SC into the register RA on the first stage and shifts the address detecting signal SC into the register RB on the follower stage. Thus, the contents stored in the shift register SREG are sequentially renewed along the progress of the cycles, whereby the register RA always stores the address detecting signal SCR obtained in the new cycle, and the register RB always stores the address detecting signal SCR obtained in the previous cycle. The address detecting signals SCR obtained in the registers RA and RB are outputted as address detecting signals SRA and SRB respectively, which are then inputted into the logic-AND gate GA. The logic-AND gate GA receives the address detecting signals SRA and SRB and performs an AND-operation and outputs the mode entry signal MENT.

The mode entry signal MENT is in the high level if the address detecting signals SRA and SRB outputted from the registers RA and RB are in the high level. This means that the identity of the address ADD with the final address is detected in both the current cycle and the previous cycle. Accordingly, similarly to the above-described first embodiment, if the read cycles for the final address are continued, then the mode entry signal MENT is in the high level. Other operations are similar to the above-described first embodiment.

The mode judging unit ADJ2 of the second embodiment does not need the chip select signal /CS and allows simplifying the circuit configuration as compared to the mode judging unit ADJ1 of the above-described first embodiment.

In this second embodiment, the two-stage shift register is used. The number of the stages may be optional. A three-stage shift register may be utilized to accept the entry if the three read cycles for the final address are continued.

An additional example will be described with reference gain to FIG. 2, wherein the functions of the address judging circuit MDJ and the command decoder MDS shown in FIG. 6 are realized on software.

In FIG. 6, the read address comparator RCMP compares the external address ADD with the final address stored in the read address register RREG and judges whether or not the final address is designated (step S1). In read cycles T1 and T2, the external address ADD is not the final address, and thus the address ADD is not identical with the final address. In this case, this judgement process will be repeated until the identity between them can be detected (step S1: NO).

Subsequently, in a read cycle T3, the final address "1FFFFFh" is designated as the external address ADD, and thus the external address ADD is identical with the final address. The read address comparator RCMP judges that the external address ADD is the final address, and outputs the high level of the address detecting signal SCR (step S1: YES). In the next read cycle T4, since the final address is designated as the external address ADD, then the address detecting signal SCR is kept in the high level (step S2: YES). If in the read cycle T4, the final address is not designated, then the process will be back to the above-described step S1 and the same processes will then be repeated. As described above, the request for the operation mode entry is accepted.

In the subsequent write cycle T5, the write address comparator WCMP compares the external address ADD to the top address "000000h" stored in the write address register WREG, and judges whether or not the top address is designated (step S4). If the top address is designated, then the command decoder MDS sets a kind of the operation mode (step S5). The command decoder MDS outputs mode data MDATA which designate the partial refresh mode as data representing the kind of the operation mode to be set. If the top address is not designated (step S4: NO), then the processes will be back to the above-described step S1 and the above-described-sequential steps will be repeated.

After the operation mode was set in the write cycle T5, then in a subsequent write cycle T6, the write address comparator WCMP compares the addresses similarly to the above-described step S4. In this cycle, since the top address is designated as the external address ADD, then the read write identity signal SCW is outputted. Upon receipt of the read write identity signal SCW, the command decoder MDS sets the detailed conditions for the operation mode. In this example, the storage area is set, which is to be refreshed in the partial refresh mode. If the top address is not designated in the write cycle T6 (step S6: NO), then the process will be back to the above-described step S1 and the above-described sequential steps will be repeated. As described above, the operation mode to be entered is decided. Thereafter, the semiconductor memory operates in the partial refresh mode.

In accordance with this example, the sequential judgement processes are executed on the software with reducing the load to the hardware. Notwithstanding, it is possible that the sequential processes functions are realized on the hardware.

In accordance with the semiconductor memories in the above-described first and second embodiments, the pre-defined timing specification may be applicable to the timing specification for the read cycle and the write cycle even for the entry of the operation mode. Accordingly, the high speed entry of the operation mode can be made with the operations in the minimum cycle time.

(Embodiment 3)

Figure 14:
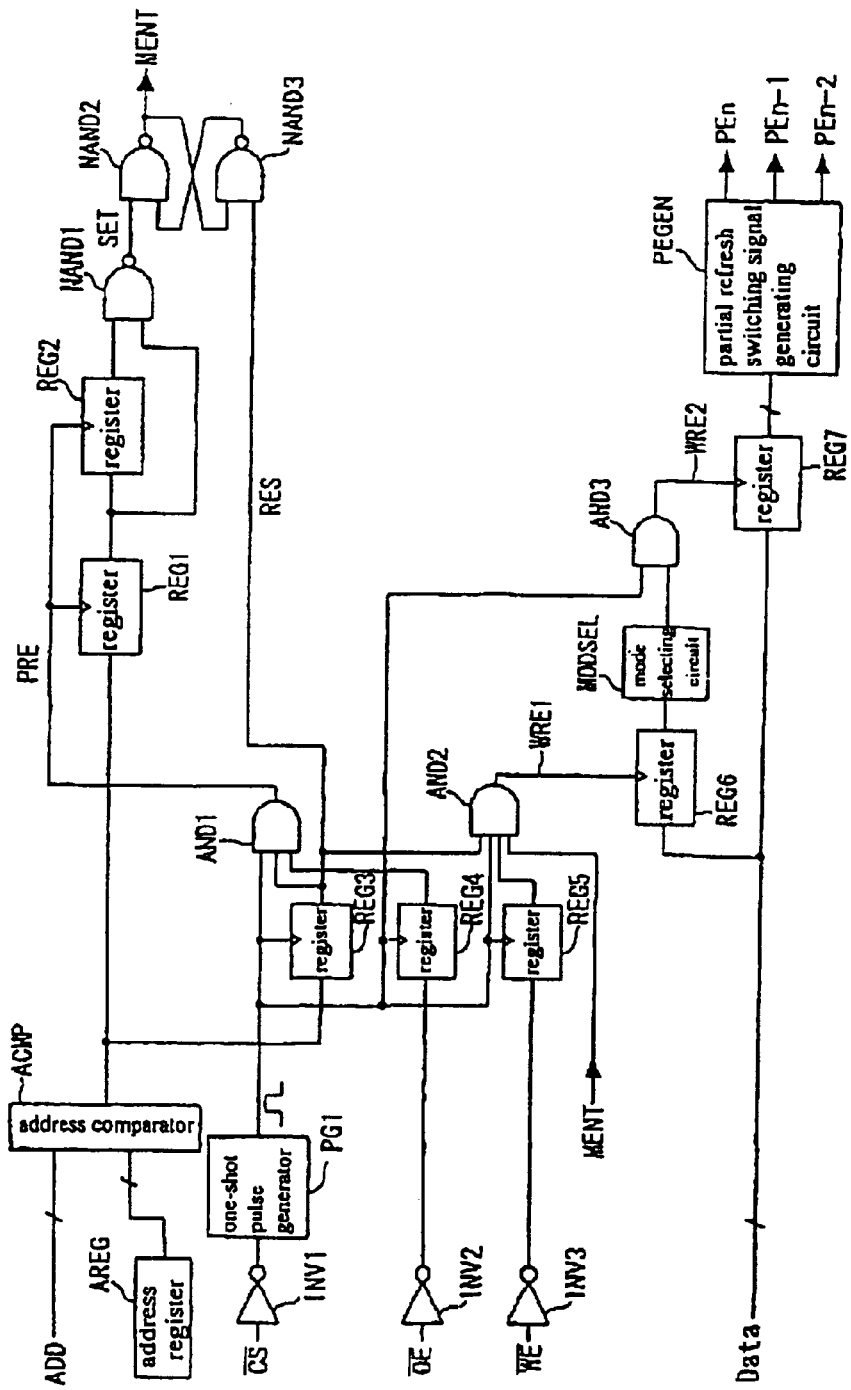
FIG. 14 is a circuit diagram illustrative of an example of a configuration of an operation mode entry circuit in accordance with the third embodiment of the present invention.

The third embodiment of the present invention will be described. FIG. 14 is a view showing the configuration of the third embodiment of the present invention. FIG. 14 shows one example of the configuration of the operation mode entry circuit MOD shown in FIG. 1. The mode data MDATA in FIG. 1 are the partial refresh switching signal. This third embodiment is to prevent the erroneous entry of the mode to the address skew.

In more details, with reference to FIG. 14, the operation mode entry circuit in accordance with this embodiment includes an address register AREG for storing a programmed address, an address comparator ACMP for receiving an address signal ADD and an address in the address register AREG and compares the input two addresses, an inverter INV1 for receiving a chip select signal /CS through a control terminal and for outputting an inverted signal thereof, a one-shot pulse generator PG1 for receiving the output signal (the inversion signal of the chip select signal /CS) and generating one-shot pulse signal with a predetermined pulse width which synchronizes with a transition into the low level of the chip select signal /CS, an inverter INV2 for receiving the output enable signal /OE through a control terminal and for outputting an inverted signal thereof, an inverter INV3 for receiving the write enable signal /WE through a control terminal and for outputting an inverted signal thereof, a register REG3 for sampling and outputting the output signal from the address comparator ACMP at a rising edge of the one-shot pulse signal outputted from the one-shot pulse generator PG1, a register REG4 for sampling and outputting the output signal from the inverter INV2 (the inversion signal of the output enable signal /OE) at a rising edge of the one-shot pulse signal outputted from the one-shot pulse generator PG1, a register REG5 for sampling and outputting the output signal from the inverter INV3 (the inversion signal of the write enable signal /WE) at a rising edge of the one-shot pulse signal outputted from the one-shot pulse generator PG1, a logic-AND gate circuit AND1 for receiving the output signal from the one-shot pulse generator PG1, the output signal from the register REG3, and the output signal from the register REG4 through three input terminals and for outputs a logical-AND of the three input signals, and a logic-AND gate circuit AND2 for receiving the output signal from the one-shot pulse generator PG1, the output signal from the register REG3, and the output signal from the register REG5 through three input terminals and for outputs a logical-AND of the three input signals.

The operation mode entry circuit in accordance with this embodiment further includes a register REG1 for sampling and outputting the output signal from the address comparator ACMP at a rising edge of the signal PRE outputted from the logic-AND gate circuit AND1, a register REG2 for sampling and outputting the output signal from the register REG1 at a rising edge of the signal PRE, a logic-NAND gate circuit NAND1 for receiving the output signal from the register REG1 and the output signal from the register REG1 through two input terminals and for outputting a logic-NAND of the two input signals, and an SR-flip-flop (also so called to as RS-flip-flop) for receiving the output signal from the logic-NAND gate circuit NAND1 as a set signal SET and the output signal from the register REG3 as a reset signal RES. This non-synchronous SR-flip-flop comprises two logic-NAND gate circuits NAND 2 and NAND 3. The logic-NAND gate circuit NAND 2 receives the output signal SET from the logic-NAND gate circuit NAND 1 and the output signal from the logic-NAND gate circuit NAND 3, and outputs the mode entry signal MENT from its output terminal. The logic-NAND gate circuit NAND 3 receives the output signal RES from the register REG3 and the output signal from the logic-NAND gate circuit NAND 2. If the signal SET is in the high level and the signal RES is also in the high level, then this SR-flip-flop holds the present state. If the mode entry signal MENT is in the low level, and the signal SET becomes the low level and the signal RES remains in the high level, then the mode entry signal MENT becomes the high level (the mode entry signal MENT is set). If the mode entry signal MENT is in the high level, and the signal SET is in the high level and the signal RES is in the low level, then the mode entry signal MENT becomes the low level (the mode entry signal MENT is reset). If the SR-flip-flop comprises the two logic-NAND gate circuits NAND 2 and NAND 3 as shown in FIG. 14, then the SR-flip-flop is activated if both the signals SET and RESET are in the low level. This SR-flip-flop may comprise two logic-NOR gate circuits NOR. In this case, the SR-flip-flop is activated if both the signals SET and RESET are in the high level. NAND1 in FIG. 14 may be replaced by the logic-AND gate circuits, and the output signal from the register REG3 is inverted by the inverter and the inverted signal is inputted into the reset terminal of the SR-flip-flop.

The operation mode entry circuit in accordance with the present invention further includes a register REG6 for sampling and outputting the data (Data) inputted through the DQ terminal (refer FIG. 1) in the write cycle with an output signal WRE1 from the logic-AND gate circuit AND2, a mode selecting circuit MODSEL for decoding the output signal from the register REG6 and selecting the mode, a two-input logic-AND gate circuit AND3 for receiving the output signal from the mode selecting circuit MODSEL and the output signal from the one-shot pulse generator PG1, and a register REG7 for sampling and outputting the data (Data) inputted through the DQ terminal in the write cycle with an output signal WRE2 from the logic-AND gate circuit AND3.

An address register AREG and an address comparator ACMP in FIG. 14 correspond to the address judging unit in the above-described second embodiment. Registers REG1 and REG2 correspond to the two-staged registers RA and RB shown in FIG. 13. In this embodiment, the registers REG1 and REG2 are different in those timing control signals from the registers RA and RB shown in FIG. 13. This embodiment is different from the above-described second embodiment in view that the single address register is provided instead of the read address register and the write address register, and also the specific address is common to both the read cycle and the write cycle. In this embodiment, the SR-flip-flop I provided instead of the gate GA shown in FIG. 13.

Timing control of the register will be described. In accordance with this embodiment, a sampling control signal ("latch timing signal" or "sampling clock signal") for the registers REG1 and REG2 and a reset signal of the SR-flip-flop are generated based on the output signal from the address comparator ACMP, the chip select signal /CS and the output enable signal /OE.

In this embodiment, the sampling control signal PRE for the registers REG1 and REG2 is in the high level, if the chip select signal /CS becomes the low level (the output signal from the one-shot pulse generator PG1 is transitioned to the high level), and the address comparator ACMP detects the address identity (the output signal from the address comparator ACMP is in the high level), and the output enable signal /OE is in the low level. If the same address signal, for example, "1FFFFFh" is continuously outputted in the two memory cycles, then the output signals from the registers REG1 and REG2 are transitioned to the high level at the rising edge of the signal PRE, whereby the set signal SET is transitioned into the low level, and the mode entry signal MENT as the output signal from the SR-flip-flop is set in the high level. The output signal RES from the register REG3 is transitioned into the low level in synchronizing with the transition into the low level of the chip select signal /CS if the address comparator ACMP detects the non-identity of the address (outputs the low level), whereby the output signal (the mode entry signal MENT) from the SR-flip-flop is reset in the low level.

The logic-AND gate circuits AND2 and AND3, the mode selecting circuit MODSEL, the registers REG6 and REG7, and the partial refresh switching circuit PEGEN constitute the mode setting unit which receives the kind of the mode and the condition for the mode set in the write cycle upon the active state of the mode entry signal MENT and performs the mode entry.

Figure 15:
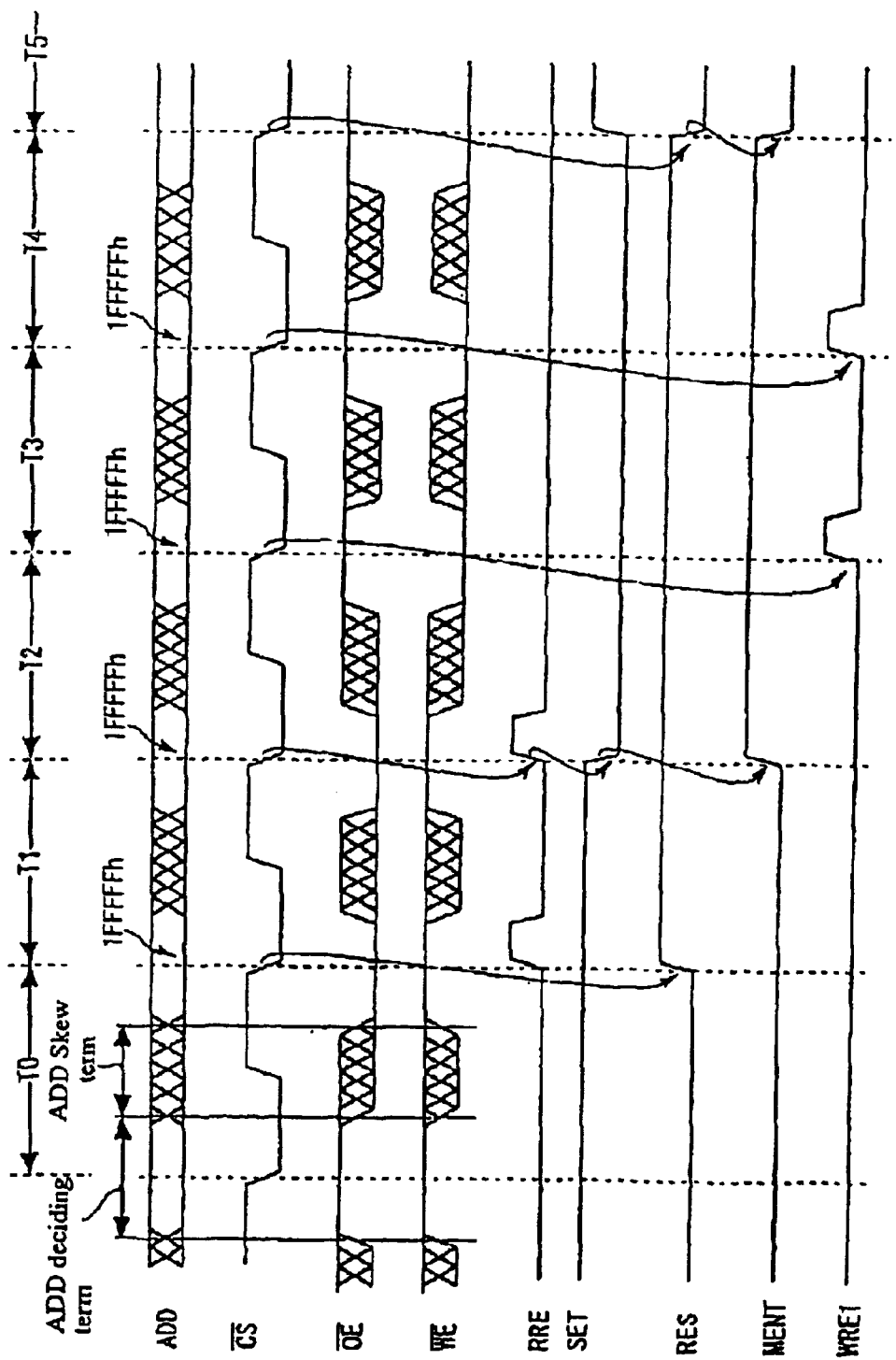
FIG. 15 is a timing chart describing operations of an operation mode entry circuit in accordance with the third embodiment of the present invention.

FIG. 15 is a view showing one example of the operation of generating the mode entry signal MENT and the timing operation of setting the mode if the mode entry signal MENT is in the active state under the configuration shown in FIG. 14. FIG. 15 schematically shows timing waveforms of the address signal ADD, and the chip select signal /CS, the output enable signal /OE and the write enable signal /WE supplied to the control terminals of the semiconductor memory, as well as signals PRE, SET, RES, MENT and WRE1 generated inside of the operation mode entry circuit. In each memory cycle, there are a time period for deciding the address and another time period for address skew due to an address delay. The chip select signal /CS is set in the active state as the initial state for the memory cycle similarly to the above-described first and second embodiments (it is transitioned into the low level in this embodiment). The output enable signal /OE is set in the low level for the read access and in the high level for the write access in a predetermined initial time period for the memory cycle. The write enable signal /WE is activated in the low level for the write access in a predetermined initial time period for the memory cycle. In this embodiment, if plural read accesses to the address "1FFFFFh" are continued for setting the mode entry, then the output enable signal /OE is transitioned from the low level to the high level in a period of time of the data output for the read cycle (refer cycles T1 and T2 in FIG. 15), whereby the data input output circuit DIO disables data output from an output buffer (not shown). Data having read out of the memory cell array in the read cycle for the mode entry are not supplied to a data bus (not shown) from the data terminal DQ (namely, this means dummy cycle). Depending upon applications, it is also possible that in the read cycle for the mode entry, the output enable signal /OE is held in the low level, and the data are supplied from the data terminal DQ and then the read data are considered to be null by a processor.

In a cycle T0, the address signal ADD is not "1FFFFFh", for which reason any operation for the operation mode entry is not made (the normal operation is made).

In a cycle T1 (read cycle), the address ADD is "1FFFFFh", and thus the output signal RES from the register REG3, which latches the output signal from the address comparator ACMP, is transitioned to the high level, at a rising edge of a pulse signal (not shown) outputted from the one-shot pulse generator PG1 when the chip select signal /CS is transitioned into the low level. If the chip select signal /CS is transitioned into the low level (the output signal from the one-shot pulse generator PG1 is transitioned into the high level) and the address comparator ACMP detects the address identity and the output enable signal /OE is in the low level, then the signal PRE is transitioned to the high level and then supplied as the sampling control signal (latch timing signal) to the registers REG1 and REG2. Further, the output signal SET from the logic-NAND gate circuit NAND1 is in the high level, whereby the SR-flip-flop holds the previous state (MENT=low level). In the data output period of the cycle T1 (read cycle), the output enable signal /OE is set in the high level to hold the output disable state.

In the next cycle T2 (read cycle), the address signal ADD is "1FFFFFh", and the output from the address comparator ACMP is in the high level. If the chip select signal /CS is transitioned into the low level (the output signal from the one-shot pulse generator PG1 is transitioned into the high level) and the address comparator ACMP detects the address identity and the output enable signal /OE is in the low level, then the signal PRE is transitioned to the high level and then supplied as the sampling control signal to the registers REG1 and REG2. Further, the output signal RES from the register REG3, which latches the output signal from the address comparator ACMP at the rising edge of the one-shot pulse upon the transition into the low level of the chip select signal /CS, remains in the high level. Since both the output signals from the registers REG1 and REG2 are in the high level, the output signal from the logic-NAND gate circuit NAND1 is in the low level, while the mode entry signal MENT is in the high level.

In the next cycle T3 (write cycle), the address signal ADD is "1FFFFFh", and the output from the address comparator ACMP is in the high level. If the chip select signal /CS is transitioned into the low level (the output signal from the one-shot pulse generator PG1 is transitioned into the high level) and the output from the address comparator ACMP is in the high level and the output enable signal /OE is in the high level, then the signal PRE as the output signal from the logic-AND gate circuit AND1 is transitioned to the low level and not risen, whereby the registers REG1 and REG2 hold the previous states. Further, the output signal RES from the register REG3 remains in the high level. The output signal SET from the logic-NAND gate circuit NAND1 is in the low level, while the mode entry signal MENT is in the high level. In the cycle T3, the data indicating the kind are inputted to the data terminal, and the entered data are fetched into the register at the rising edge of the signal WRE1.

The mode selecting circuit MODSEL receives and decodes the output signal from the register REG6, and activates the output signal (high level) if the output signal from the register REG6 is a predetermined mode. In this embodiment, the mode selecting circuit MODSEL identifies that the operation mode is the partial refresh mode (FIG. 4(b)), then the mode selecting circuit MODSEL places the output signal into the active state.

In the next cycle T4 (write cycle), the address signal ADD is "1FFFFFh", and the output from the address comparator ACMP is in the high level. If the chip select signal /CS is transitioned into the low level (the output signal from the one-shot pulse generator PG1 is transitioned into the high level) and the output from the address comparator ACMP is in the high level and the output enable signal /OE is in the high level, then the signal PRE as the output signal from the logic-AND gate circuit AND1 is transitioned to the low level and not risen, whereby the registers REG1 and REG2 hold the previous states. Further, the output signal RES from the register REG3 remains in the high level. The output signal SET from the logic-NAND gate circuit NAND1 is in the low level, while the mode entry signal MENT is in the high level.

In the cycle T4, the data indicating conditions are inputted into the data terminal DQ, and the entered condition data are sampled by the register REG7 at a riding edge of a signal WRE2. The signal WRE2 is the one shot pulse signal which was generated by the one-shot pulse generator PG1 at a falling edge of the chip select signal /CS and then passed through the logic-AND gate circuit AND3 which receives the activated signal outputted from the mode selecting circuit MODSEL. The condition data fetched into the register REG7 in the cycle T4 are then supplied to the partial refresh switching circuit PEGEN. The partial refresh switching circuit PEGEN outputs partial refresh switching signals PEn, PEn-1 and PEn-2. Values set for the partial refresh switching signals PEn, PEn-1 and PEn-2 are held until the next partial refresh switching signals are set in the power-on state.

In the cycle T5, the address signal ADD is not "1FFFFFh", whereby the output from the address comparator ACMP is in the low level. The output signal RES from the register REG3 is transitioned to the low level at the rising edge of the one-shot pulse generated by the one-shot pulse generator PG1 at the falling edge of the chip select signal /CS, whereby the mode entry signal MENT as the output signal from the SR-flip-flop is transitioned into the low level. If the mode entry signal MENT is in the low level, then the sampling control signal WRE1 is in the low level, whereby the data are not sampled by the register REG6. The output signal from the mode selecting circuit MODSEL is not activated, and the sampling control signal WRE2 is in the low level, whereby the data are not sampled by the register REG7.

In the above-described embodiment, data for the kind and condition may be set in width of data, so that they are fetched in one write cycle, or the data for the kind and condition may be set in at least two write cycles.

Set values for the partial refresh switching signals PEn, PEn-1 and PEn-2 are supplied as the mode data MDATA to the refresh control circuit RSH shown in FIG. 1, wherein the values of the partial refresh switching signals PEn, PEn-1 and PEn-2 are supplied to a refresh address generating circuit (not shown) in the refresh control circuit RSH, so that respective logic operations (for example, NOR-operation) between the values of the partial refresh switching signals PEn, PEn-1 and PEn-2 and the most significant bit, the second significant bit and the third significant bit of the refresh address are made and results of the operations are supplied to a row decoder for the refresh operation. If the partial refresh switching signal PEn is in the high level, then the most significant bit of the refresh address is set in the low level (is masked), and a half of the memory area is refreshed. If the partial refresh switching signals PEn and PEn-1 are in the high level, then the most significant bit and the second significant bit of the refresh address are set in the low level (are masked), and one quarter of the memory area is refreshed. The partial refresh switching signals PEn, PEn-1 and PEn-2 may be supplied as the mode data MDATA to the voltage generating circuit VGEN (refer FIG. 1), so that the voltage generating circuit VGEN performs a power supply for the partial refresh operation in the stand-by state based on those signals.

In the semiconductor memory configured to receive the non-synchronous input of the address signal, a skew generated on the address signal in the system is inputted into the address terminal of the memory chip, and the designation of the same address by the processor cases the address skew. In the above-described embodiment of applying the present invention to the non-synchronous semiconductor memory, the chip select signal /CS, which is transitioned to the active state in every access cycles, is used to generate the timing edge as the trigger for fetching the address for every cycles and the prevention to the erroneous entry due to the address skew can be realized.

In the above-described embodiment, it is not essential that the operation mode entry circuit MOD is provided in the same chip as the semiconductor memory. It is also possible that the operation mode entry circuit MOD is connected to a processor and a part or all of the functions of the operation mode entry circuit MOD is provided in a memory controller IC which controls the semiconductor memory. Needless to say, the present invention may be applicable to a configuration that a variety of logic circuits such as the memory, the processor and the memory controller is integrated on the same chip.

The mode setting unit CDE (refer FIG. 6) in the above-described first embodiment is not limited to the above-described configuration that if the write address comparator WCMP detects the address identity, then the command data are entered through the data terminal DQ. As a modification to the above-described first embodiment, the command decoder MDS of the mode setting unit CDE may be configured to enter any combination of the signals inputted through the address terminal ADD and/or the predetermined control terminals such as a byte control terminal as the operation mode to be entered (the kind and the condition of the operation mode) if the mode entry signal MENT is in the active state. It is also possible that instead of the data inputted through the data terminal DQ (refer FIG. 1), any combination of the signals inputted through the address terminal ADD and/or the predetermined control terminals such as a byte control terminal is inputted as the mode data to be supplied to the register REG6 and the register REG7. In the semiconductor memory device of the embodiment of the present invention, the operation mode information entered through the data terminal DQ is not to be stored in the memory cell array MARY, but the operation mode information may be signals entered through the address terminal and/or the control terminals for the operation mode entry.

In the above-described first to third embodiments, the operation mode entry circuit MOD is configured to judge whether the current cycle is the read cycle or the write cycle based on the control signal inputted through the control terminal, and if the address is identical with the predetermined read address in the continuous two read cycles, then the operation mode entry circuit MOD places the mode entry signal MENT into the active state. If the condition for enabling the mode entry is the continuation of the read operations for the predetermined address, then this secures the prevention of writing data in the memory cell array (preventing the overwrite). Notwithstanding, the condition for placing the mode entry signal MENT into the active state is not limited to the continuation of the read operations for the predetermined address.

As a modification to the above-described first to third embodiments, it is also possible that if the current cycle is judged to be the read cycle and the address inputted through the address terminal is identical with the predetermined address, and further if the next cycle is the write cycle and the address inputted through the address terminal is identical with the predetermined address, then the mode entry signal MENT is placed into the active state. In accordance with this modification, in the mode setting unit shown in FIG. 7 or FIG. 10, the output signal from the read address comparator RCMP, which compares the address stored in the read address register RREG to the input address, is inputted into the latch LATA in FIG. 7 or the register RA in FIG. 13, as well as the output signal from the write address comparator WCMP (refer FIG. 6), which compares the address stored in the write address register WREG (refer FIG. 6) to the input address, is inputted into the latch LATB in FIG. 7 or the register RB in FIG. 13, as well as the inversion signal of the read write identification signal SRW is inputted into the gate circuit GA shown in FIG. 7 or FIG. 10. In this case, if both the output signals from the latch LATA (the register RA) and the latch LATB (the register RB) are in the high level, and the read write identification signal SRW is in the low level, then the gate circuit GA outputs the high level of the mode entry signal MENT. If the same address is assigned for the read address and the write address, then a single set of the address register and the address comparator is necessary.

If the current cycle is judged to be the write cycle and the address inputted through the address terminal is identical with the predetermined address, and further if the next cycle is the read cycle and the address inputted through the address terminal is identical with the predetermined address, then the mode entry signal MENT is placed into the active state. In accordance with this modification, in the mode setting unit shown in FIG. 7 or FIG. 10, the output signal from the read address comparator RCMP, which compares the address stored in the read address register RREG to the input address, is inputted into the latch LATB in FIG. 7 or the register RB in FIG. 13, as well as the output signal from the write address comparator WCMP (refer FIG. 6), which compares the address stored in the write address register WREG (refer FIG. 6) to the input address, is inputted into the latch LATA in FIG. 7 or the register RA in FIG. 13, as well as the inversion signal of the read write identification signal SRW is inputted into the gate circuit GA shown in FIG. 7 or FIG. 10. In this case, in the initial cycle, the inputted through the data terminal DQ are stored at the predetermined address of the memory cell array. Namely, in this write cycle, data dedicated for the ode entry (which may be any dummy data) are stored at a predetermined write address. As a further modification to the first to third embodiments, it is also possible that if the current cycle is judged to be the write cycle and the address inputted through the address terminal is identical with the predetermined address, and further if the next cycle is the write cycle and the address inputted through the address terminal is identical with the predetermined address, then the mode entry signal MENT is placed into the active state. In accordance with this modification, the sampling control signal PRE supplied to the registers REG1 and REG2 described in the third embodiment with reference to FIG. 14 may be generated by an logical-AND operation by the logic-AND gate of a signal obtained by causing the register REG3 to sample the output signal from the address comparator ACMP at the rising edge of the one-shot pulse outputted from the one-shot pulse generator PG1, another signal obtained by causing the register REG4 to sample the output enable signal /OE (or the register REG5 to sample the inversion signal of the write enable signal /WE) at the rising edge of the one-shot pulse outputted from the one-shot pulse generator PG1, and the output signal from the one-shot pulse generator PG1.

As a further more modification to the first to third embodiments, it is possible that the if the mode entry signal MENT is transitioned from the inactive state to the active state, then subsequent to this time, the mode setting unit CDE is configured to decide the operation mode to be entered based on a signal inputted through at least one of the address terminal, the control terminals and the data terminal, or combinations thereof (for example, a combination of a predetermined bit of the address terminal and a predetermined terminal in the control terminals).

Whereas the first to third embodiments of the present invention have been described, the present invention should not be limited to those embodiments but include any design changes in the extent of the subject matter of the present invention. Namely, the present invention, of course, include a variety of modifications and revisions which might be made by the person skilled in the art but within the scope of the claims.

EFFECT OF THE INVENTION

The present invention provides the follows effects.

If the read cycles are continued for the plural addresses, the request for he entry is accepted to decide the operation mode to be entered based on the data designated by the write cycle following to the read cycles, so as to enable the operation mode entry of the semiconductor memory during operation without need of any specific timing specification but with an effective suppression to the erroneous entry.

In the read cycle, the specific address to be designated externally is stored, and the stored specific address is compared to the address designated sequentially and externally, so as to judge that at least two read cycles are continued for the specific address upon result of the comparison result, thereby accepting the request for the entry if the read cycles for the plural addresses are continued.

In the write cycle following to the read cycles, the specific address to be designated externally is stored, and the stored specific address is compared to the address designated sequentially and externally, so as to decide the operation mode based ion the data designated in the write cycle upon receipt of the comparison result, whereby the operation mode to be entered is decided based on the data designated in the write cycle following to the read cycles.

If the same address is designated for the plural addresses, then the request for the operation mode entry is accepted to effectively present any erroneous entry.

If any of the final address and the top address is designated for the above plural addresses, the request for the operation mode entry is accepted for avoiding any substantive restriction to the address space in the system side, in which the semiconductor memory is integrated.

If one of the top address and the final address is designated as the address for the read cycle, and if another of the top address and the final address is designated as the address for the write cycle, then the request for the operation mode entry is accepted with further effective suppression to the erroneous entry.

A partial refresh mode is accepted for refreshing a partial area of the memory cell array comprising the matrix array of the dynamic memory cells, so as to allow a selective refresh to the storage area based on the scale of the data to be stored, and effectively prevent any unnecessary current consumption for the refresh operation.

Whereas the first to third embodiments of the present invention have been described, the present invention should not be limited to those embodiments but include any design changes in the extent of the subject matter of the present invention. For example, in the above-described embodiments, the final address is continuously designated for the plural addresses in the read cycle. Notwithstanding, it is also possible that different addresses from each other are designated for the plural addresses For the write address, different addresses from each other may be designated.

In the above-described embodiments, the top address is designated in the write cycle, while the final address is designated in the read cycle. Notwithstanding, it is also possible that the same address is designated for the read and write cycles.

In the above-described embodiments, the entry is accepted if at least two read cycles are continued. Notwithstanding, it is also possible that the entry is accepted if plural read cycles are continued, wherein increasing the number of the plural read cycles to be continued increase the effect of preventing the erroneous entry.

In the above-described embodiments, the command data are designated in the separate two write cycles for deciding the entry. Notwithstanding, it is also possible that the command data are designated in the single write cycle. It is also possible that the command data are designated in at least three write cycles.

In the above-described embodiments, the chip select signal /CS is transitioned in synchronizing with the address ADD. Notwithstanding, it is also possible that the chip select signal /CS is fixed at the low level (in the active state). In accordance with the above-described embodiments, if the chip select signal /CS synchronizes with the address signal, then the strict condition for accepting the entry is present, which increases the effect of preventing the erroneous entry.

In the above-described embodiments, the descriptions have been made by taking an example that the partial refresh mode is the operation mode to be entered. Notwithstanding, it is also possible that any operation modes for allowing the read operation and the write operation may be subject to the operation mode entry.

In accordance with the present invention, the read address and the write address to be used for the mode entry are the common predetermined address to simplify the configuration. Further, in accordance with the present invention, a flip-flip is provided which set a signal controlling the enabling of the mode entry in the active state if the access address is identical with the predetermined address, for simplifying the timing design with increasing a stability (time margin) such as an address skew to secure the prevention of the erroneous entry.

In accordance with the present invention, a combination of the read accesses and the write accesses in the predetermined sequence is detected for the predetermined address to place the signal controlling the enabling of the mode entry into the active state, whereby the same effects or at least one of the effects mentioned above can be provided.

What is claimed is:

1. A method of entry of operation mode of a semiconductor memory, the method including:
   (a) a first step of accepting a request for an operation mode entry when read cycles for plural addresses continued; and
   (b) a second step of deciding an operation mode to be entered, based on data designated in a write cycle following to said read cycles.

2. The method of entry of operation mode of a semiconductor memory as claimed in claim 1, wherein said first step includes the steps of:
   comparing a first specific address previously stored to addresses designated sequentially and externally in said read cycles; and
   judging that at least two read cycles for said first specific address have been continued, upon receipt of a result of said comparison.

3. The method of entry of operation mode of a semiconductor memory as claimed in claim 1, wherein said second step includes the steps of:
   comparing a second specific address previously stored to addresses designated sequentially and externally in said write cycle following to said read cycles; and
   deciding an operation mode based on data designated in said write cycle, upon receipt of a result of said comparison.

4. The method of entry of operation mode of a semiconductor memory as claimed in claim 1, wherein said first step is to accept an operation mode entry if addresses identical with each other were designated as said plural addresses.

5. The method of entry of operation mode of a semiconductor memory as claimed in claim 1, wherein said first step is to accept an operation mode entry if any one of a final address and a top address was designated as said plural addresses.

6. The method of entry of operation mode of a semiconductor memory as claimed in claim 1, wherein said second step is to accept an operation mode entry if one of a final address and a top address was designated as an address for said read cycle, and said second step is to decide an operation mode to be entered if another of said final address and said top address was designated as an address for said write cycle.

7. The method of entry of operation mode of a semiconductor memory as claimed in claim 1, wherein said first step is to accept a partial refresh mode as an operation mode to be entered for refreshing a partial area in a memory cell array comprising a matrix array of dynamic memory cells, and
   said second step is to decide said partial refresh mode as said operation mode to be entered.

8. A semiconductor memory configured to enable an operation mode entry during operation thereof, said semiconductor memory including:
   an operation mode entry circuit for accepting a request for an operation mode entry when read cycles for plural addresses continued; and for deciding an operation mode to be entered, based on data designated in a write cycle following to said read cycles.

9. The semiconductor memory as claimed in claim 8, wherein said operation mode entry circuit includes:
   a storage unit for storing a first specific address to be designated externally in said read cycles;
   a comparing unit for comparing said first specific address stored in said storage unit to addresses designated sequentially and externally; and
   a judging unit for judging that at least two read cycles for said first specific address have been continued, upon receipt of a result of said comparison by said comparing unit.

10. The semiconductor memory as claimed in claim 8, wherein said operation mode entry circuit includes:
    a storage unit for storing a second specific address to be designated externally in said write cycle following to said read cycles;
    a comparing unit for comparing said second specific address stored in said storage unit to addresses designated sequentially and externally; and
    a deciding unit for deciding an operation mode based on data designated in said write cycle, upon receipt of a result of said comparison by said comparing unit.

11. The semiconductor memory as claimed in claim 8, wherein said operation mode entry circuit accepts an operation mode entry if addresses identical with each other were designated as said plural addresses.

12. The semiconductor memory as claimed in claim 8, wherein said operation mode entry circuit accepts an operation mode entry if any one of a final address and a top address was designated as said plural addresses.

13. The semiconductor memory as claimed in claim 8, wherein said operation mode entry circuit accepts an operation mode entry if one of a final address and a top address was designated as an address for said read cycle, and if another of said final address and said top address was designated as an address for said write cycle.

14. The semiconductor memory as claimed in claim 8, wherein said operation mode entry circuit accepts a partial refresh mode as an operation mode to be entered for refreshing a partial area in a memory cell array comprising a matrix array of dynamic memory cells.

15. A method of entry of operation mode of a semiconductor memory which includes at least:
 a memory cell array comprising an array of plural memory cells;
 an address terminal for input of address;
 a data terminal for input and output of data;
 control terminals for input of a control signal for an access control, a write control, and an output control of read data for said semiconductor memory,
 said entry method being made by an operation mode entry circuit for entry of an operation mode of said semiconductor memory, based on addresses inputted into said address terminal, control signals inputted into said control terminals, and data inputted into said data terminal,
 wherein said method includes the steps of:
 judging whether a current cycle is a read cycle or a write cycle based on a control signal inputted into said control terminal;
 comparing and judging whether or not an address inputted into said address terminal is identical with a predetermined address if said current cycle is the read cycle;
 comparing and judging whether or not respective addresses inputted into said address terminal are identical with predetermined addresses in one or more read cycles following to said read cycle if an identity of said address was confirmed;
 setting, into an active state, a mode entry signal for controlling the enabling of the operation mode entry if an identity of said address was detected in said continuing plural read cycles; and
 comparing and judging whether or not an address inputted into said address terminal in at least one write cycle following to said continuing plural read cycles is identical with a predetermined address, and deciding an operation mode to be entered based on data inputted into said data terminal if said identity is detected.

16. The method of entry of operation mode of a semiconductor memory as claimed in claim 15, wherein said step of deciding said operation mode to be entered includes:
 comparing and judging whether or not an address inputted into said address terminal is identical with a predetermined address in a write cycle following to said plural read cycles;
 selecting a kind of an operation mode based on data inputted into said data terminal in said write cycle if an address identity is confirmed;
 comparing and judging whether or not an address inputted into said address terminal is identical with a predetermined address in a next write cycle to said write cycle; and
 setting conditions for said operation mode based on data inputted into said data terminal in said next write cycle if an address identity is confirmed.

17. A semiconductor device which includes:
 a memory cell array comprising an array of plural memory cells;
 an address terminal for input of address;
 a data terminal for input and output of data;
 a control terminal for input of a control signal for an access control, a write control, and an output control of read data for said semiconductor memory;
 an operation mode entry circuit for controlling an entry of an operation mode of said semiconductor memory device, based on addresses inputted into said address terminal, a control signal inputted into said control terminal, and data inputted into said data terminal,
 wherein said operation mode entry circuit further includes:
 means for judging whether a current cycle is a read cycle or a write cycle based on said control signal inputted into said control terminal;
 means for comparing and judging whether or not an address inputted into said address terminal is identical with a predetermined address if said current cycle is the read cycle;
 means for setting, into an active state, a mode entry signal which controls the enabling of the operation mode entry, if an address inputted into said address terminal in one or more read cycles following to said read cycle is identical with a predetermined address if an identity of said address was confirmed in said read cycle; and
 means for comparing and judging whether or not an address inputted into said address terminal in at least one write cycle following to said plural read cycles is identical with a predetermined address, and for deciding an operation mode to be entered based on data inputted into said data terminal if said identity is detected.

18. The semiconductor device as claimed in claim 17, wherein said means for deciding said operation mode to be entered includes:
 an address comparing means for comparing and judging whether or not an address inputted into said address terminal is identical with a predetermined address in a write cycle following to said plural read cycles;
 means for selecting a kind of an operation mode based on data inputted into said data terminal in said write cycle if an address identity is confirmed as a result of said comparison; and
 means for comparing and judging whether or not an address inputted into said address terminal is identical with a predetermined address in a next write cycle to said write cycle, and for setting conditions for said operation mode based on data inputted into said data terminal in said next write cycle if an address identity is confirmed as a result of said comparison.

19. A semiconductor device which includes:
 a memory cell array comprising an array of plural memory cells;
 an address terminal for input of address;

a data terminal for input and output of data;

first to third control terminals for respective inputs of a first control signal for controlling selection of a semiconductor memory, a second control signal for controlling an input and an output of data from said data terminal; and a third control signal for controlling data write and read operations;

an operation mode entry circuit for controlling an entry of an operation mode of said semiconductor memory device, based on addresses inputted into said address terminal, control signals inputted into said first to third control terminals, and data inputted into said data terminal, wherein said operation mode entry circuit further includes:

a read write judging unit for judging whether a current cycle is a read cycle or a write cycle based on said second and third control signals if said first control signal is in an active state, and for outputting a read write identity signal;

a mode judging unit for judging a presence of an absence of a request for entry, based on an address designated in said read cycle, and for outputting a mode entry signal which controls enabling of an operation mode entry, and said mode judging unit further including: an address comparator for comparing and judging whether or not an address inputted into said address terminal is identical with a predetermined address if said read write judging unit judges that said current cycle is said read cycle; and means for setting said mode entry signal into an active state if said address comparator indicates identitys continuously in one or more read cycles following to said read cycle; and a mode setting unit for generating and outputting mode data based on command data supplied to said data terminal in at least one write cycle following to said continuos plural read cycles if said entry signal is in said active state.

20. The semiconductor device as claimed in claim 19, wherein said mode judging unit includes:

means for detecting that said address comparator indicates the identity continuously in plural read cycles; and a flip-flop for setting said mode entry signal in said active state if it is detected that said address comparator indicates identitys continuously in plural read cycles, and for re-setting said mode entry signal in an inactive state if said address comparator indicates non-identity.

21. The semiconductor device as claimed in claim 19, wherein said mode setting unit includes:

a write address register for storing a predetermined write address;

a write address comparing unit for comparing and judging whether or not an address inputted into said address terminal is identical with said predetermined write address stored in said write address register if said read write judging unit judges that a cycle following to said read cycle is a write cycle; and a command decoder for deciding an operation mode to be entered, based on data entered through said data terminal and for outputting said decided operation mode as mode data if said write address comparing unit judges an identity.

22. The semiconductor device as claimed in claim 19, wherein said mode judging unit includes:

a read address register for storing a predetermined read address;

a read address comparator for comparing an address inputted through said address terminal to said read address stored in said read address register at a timing of output of a pulse signal upon an address transition by an address transition detecting circuit, and for outputting an address detecting signal upon detection that said input address is identical with said read address;

first and second latch circuits for latching said address detection signal based on input first and second latch signals respectively, and for outputting first and second address detection signals;

a logic gate circuit for operating a logical-AND of said first and second address detection signals and a read write identity signal from said read write judging unit, and for outputting a result of said operations as said mode entry signal; and a latch control unit for generating and outputting first and second latch signals which control latch operations of said first and second latch circuits respectively, based on a pulse signal outputted upon an address transition from said address transition detecting circuit, and also based on said first control signal.

23. The semiconductor device as claimed in claim 22, wherein said latch control unit includes:

a toggle flip-flop circuit for receiving an input of said first control signal and for inverting a value of its output signal by triggering a transition into an active state of said first control signal;

a first logic gate circuit for receiving an input of said pulse signal which is outputted at an address transition from said address transition detecting circuit and also an input of an inverted signal of said output signal from said toggle flip-flop circuit, and for outputting a result of a logical-AND operation of said two inputs as a first latch signal; and a second logic gate circuit for receiving an input of said pulse signal which is outputted at an address transition from said address transition detecting circuit and also an input of said output signal from said toggle flip-flop circuit, and for outputting a result of a logical-AND operation of said two inputs as a second latch signal.

24. The semiconductor device as claimed in claim 19, wherein said read write judging unit includes:

a first logic gate circuit for receiving, through first and second input terminals, an inversion signal of said first control signal and an inversion signal of said second control signal respectively and also receiving, through a first input terminal, said third control signal, and for outputting, from an output terminal, a logical-AND of said three input signals;

a second logic gate circuit for receiving, through first and third input terminals, an inversion signal of said first control signal and an inversion signal of said third control signal respectively and also receiving, through a second input terminal, said second control signal, and for outputting, from an output terminal, a logical-AND of said three input signals; and an SR-flip-flop for receiving, through a set terminal, said output signal from said output terminal of said first logic gate circuit, and receiving, through a reset terminal, said output signal from said output terminal of said second logic gate circuit, and for outputting, from an output terminal, said read write identity signal.

25. The semiconductor device as claimed in claim 19, wherein said mode judging unit includes:

an address comparator for comparing a read address stored in a read address register to an address inputted into said address terminal in a read cycle;

a first register for receiving an output signal from said address comparator;

a second register for receiving an output from said first register; and a logic gate circuit for receiving output signals from said first and second registers, and for outputting, as said mode entry signal, a logic-AND of said output signals from said first and second registers and a read write identity signal from said read write judging unit, and wherein a pulse signal which is outputted at an address transition from an address transition detecting circuit for detecting an address transition is supplied as a sampling control signal to said first and second registers.

26. A semiconductor device which includes:

a memory cell array comprising an array of plural memory cells;

an address terminal for input of address;

a data terminal for input and output of data;

an operation mode entry circuit for entry of an operation mode of a semiconductor memory, wherein said operation mode entry circuit receives, as control signals, a first control signal inputted into a first control terminal and said first control signal being in an active state in a memory cycle for selecting a chip of said semiconductor memory;

a second control signal inputted into a second control terminal and said first control signal being in an active state for controlling input and output of data through said data terminal and for outputting data;

a third control signal inputted into a third control terminal and said first control signal being in an active state for a write operation, and wherein said operation mode entry circuit includes:

an address comparator for receiving an input of an address inputted into said address terminal and an input of a predetermined address stored in a storage unit, and for comparing whether or not said two input addresses are identical with each other, and for outputting an output signal in an active state if an identity is detected;

a pulse generating circuit for generating one-shot pulse signal based on a transition to an active state of said first control signal;

a first register for sampling and outputting an output signal from said address comparator under a sampling control signal which is said pulse signal outputted from said pulse generating circuit;

a second register for sampling and outputting said second control signal under said pulse signal as a sampling control signal;

a first logic gate circuit for receiving an output signal from said first register, an output signal from said second register, and said pulse signal, and for outputting a result of a logical-AND of said three input signals as a sampling control signal;

a series connection of plural stage registers for commonly receiving said sampling control signal, wherein an output signal from said address comparator is inputted into a first stage register of said plural stage registers;

a second logic gate circuit for receiving an output signal from said plural stage registers, and outputting an output signal in an active state if said output signal from said plural stage registers indicates an active state;

an SR-flip-flop for receiving, through a set terminal, an output signal from said second logic gate circuit as a set signal, receiving, through a reset terminal, an output signal from said first register as a reset signal, and for outputting, from an output terminal, a mode entry signal which controls enabling of an operation mode entry; and a mode setting circuit for receiving said mode entry signal from said SR-flip-flop, said output signal from said first register, and said third control signal, and for receiving and decoding data inputted into said data terminal in at least one write cycle, wherein an address inputted into said address terminal is identical with a predetermined address if said mode entry signal is in an active state, and for setting an operation mode based on a result of decoding.

27. The semiconductor device as claimed in claim 26, wherein said mode setting circuit includes:

a third register for sampling said third control signal based on said pulse signal;

a third logic gate circuit for generating a second sampling control signal based on said pulse signal if said output signal from said first register is in an active state and said output signal from said third register is in an active state;

a fourth register for sampling and outputting data from said data terminal based on said second sampling control signal from said third logic gate circuit;

a mode selecting circuit for mode selection based on an output signal from said fourth register;

a fourth logic gate circuit for receiving said pulse signal and generating a third sampling control signal if an output signal from said mode selecting circuit;

a fifth register for sampling and outputting data from said data terminal based on said third sampling control signal; and a switching signal generating circuit for outputting a switching signal for switching operations based on an output signal from said fifth register.

28. The semiconductor device as claimed in claim 26, further including:

a refresh control circuit for generating a refresh address for automatic refresh if a timeout appears in a timer counting a time, and wherein said operation switching signal is used as a signal for masking a predetermined higher significant bit of said generated refresh address, and a refresh area varies based on said operation switching signal from said operation mode entry circuit.

29. The semiconductor device as claimed in claim 19, wherein said semiconductor memory comprises a pseudo SRAM (static random access memory) which comprises a dynamic semiconductor memory with a self-refresh function, and wherein said first to third control signals comprise a chip select signal for SRAM, an output enable signal and a write enable signal respectively.

30. The semiconductor device as claimed in claim 19, wherein said mode setting unit includes means for generating and outputting mode data based on signals supplied to said address terminal and/or a predetermined control terminal, instead of said data terminal, in at least one write cycle following to said continuous plural read cycles, if said mode entry signal is an active state.

31. The semiconductor device as claimed in claim 19, wherein said mode setting unit includes:

a write address register for storing a predetermined write address;

a write address comparing unit for comparing and judging whether or not an address inputted into said address terminal is identical with said predetermined write address stored in said write address register if said read write judging unit judges that a cycle following to said read cycle is a write cycle; and a command decoder for deciding an operation mode to be entered, based on data entered through said address terminal and/or a predetermined control terminal, instead of said data terminal, if an identity is detected as a comparing result by said write address comparing unit.

32. The semiconductor device as claimed in claim 26, wherein said mode setting circuit includes means for receiving said mode entry signal from said SR-flip-flop, said output signal from said first register, and said third control signal, and for receiving and decoding a signal inputted into said address terminal and/or a predetermined control terminal, instead of said data terminal, in at least one write cycle, wherein an address inputted into said address terminal is identical with a predetermined address if said mode entry signal is in an active state, and for setting an operation mode based on a result of decoding.

33. A method of controlling an operation mode entry of a semiconductor memory by an operation mode entry circuit, based on at least one of an address inputted into an address terminal of said semiconductor memory, a control signal inputted into a control terminal of said semiconductor memory and controlling at least read and write accesses, and a data signal inputted into a data terminal of said semiconductor memory, wherein said method includes the steps of: monitoring said address inputted into said address terminal and said control signal inputted into said control terminal; detecting an access cycle which comprises any one of a predetermined plurality of read cycles for predetermined addresses, and a predetermined plurality of write cycles for predetermined addresses, and a predetermined sequence of read cycles for predetermined addresses and write cycles for predetermined addresses; and enabling an operation mode entry if said access cycle for said predetermined address appears predetermined times, and wherein said method further includes the steps of:

deciding an operation mode to be entered, based on a signal inputted into any one or combinations of said data terminal, said address terminal and said control terminal, if said operation mode entry is enabled.

34. A method of entry of operation mode of a semiconductor memory which includes at least:

a memory cell array comprising an array of plural memory cells;

an address terminal for input of address;

a data terminal for input and output of data;

a control terminal for input of a control signal for an access control, a write control, and an read control for said semiconductor memory, said entry method being made by an operation mode entry circuit for entry of an operation mode of said semiconductor memory, based on at least one of an address inputted into said address terminal, a control signal inputted into said control terminal, and a data signal inputted into said data terminal, wherein said method includes the steps of:

judging whether a current cycle is a read cycle or a write cycle based on a control signal inputted into said control terminal;

comparing and judging whether or not an address inputted into said address terminal is identical with a predetermined address if said current cycle is a predetermined access cycle of said read cycle and said write cycle;

comparing and judging whether or not respective addresses inputted into said address terminal are identical with predetermined addresses in a predetermined read cycle, or a predetermined write cycle or predetermined one or more cycles comprising a combination of read and write cycles, following to said predetermined access cycle if an identity of said address was confirmed;

setting, into an active state, a mode entry signal for controlling the enabling of the operation mode entry if an identity of said address was detected in said each cycle; and deciding an operation mode to be entered based on signals entered through at least one or combinations of said address terminal, said control terminal and said data terminal if said mode entry signal is in said active state.

35. A semiconductor device including:

a memory cell array comprising an array of plural memory cells;

an address terminal for input of address;

a data terminal for input and output of data;

a control terminal for input of a control signal for an access control, a write control, and an output control for read data for a semiconductor memory;

an operation mode entry circuit for entry of an operation mode of said semiconductor memory, based on at least one of an address inputted into said address terminal, a control signal inputted into said control terminal, and a data signal inputted into said data terminal, wherein said operation mode entry circuit further includes:

means for judging whether a current cycle is a read cycle or a write cycle based on a control signal inputted into said control terminal;

means for comparing and judging whether or not an address inputted into said address terminal is identical with a predetermined address if said current cycle is a predetermined access cycle of said read cycle and said write cycle;

means for comparing and judging whether or not respective addresses inputted into said address terminal are identical with predetermined addresses in a predetermined read cycle, or a predetermined write cycle or predetermined one or more cycles comprising a combination of read and write cycles, following to said predetermined access cycle if an identity of said address was confirmed;

means for setting, into an active state, a mode entry signal for controlling the enabling of the operation mode entry if an identity of said address was detected in said each cycle; and means for deciding an operation mode to be entered based on signals entered through at least one or combinations of said address terminal, said control terminal and said data terminal if said mode entry signal is in said active state.

36. The semiconductor device as claimed in claim 26, wherein said semiconductor memory comprises a pseudo SRAM (static random access memory) which comprises a dynamic semiconductor memory with a self-refresh function, and wherein said first to third control signals comprise a chip select signal for SRAM, an output enable signal and a write enable signal respectively.

* * * * *